(12) United States Patent
Shin et al.

(10) Patent No.: US 10,303,008 B2
(45) Date of Patent: May 28, 2019

(54) DISPLAY DEVICE AND MASK FOR MANUFACTURING DISPLAY DEVICE

(71) Applicant: Samsung Display Co., Ltd., Yongin-si, Gyeonggi-do (KR)

(72) Inventors: Cheol Shin, Hwaseong-si (KR); Hak Sun Chang, Yongin-si (KR); Chang Il Tae, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 94 days.

(21) Appl. No.: 15/408,559

(22) Filed: Jan. 18, 2017

(65) Prior Publication Data

US 2017/0315411 A1    Nov. 2, 2017

(30) Foreign Application Priority Data

Apr. 28, 2016 (KR) .................. 10-2016-0052383

(51) Int. Cl.
*H01L 27/12* (2006.01)
*G02F 1/1343* (2006.01)
*G02F 1/1362* (2006.01)

(52) U.S. Cl.
CPC .. *G02F 1/134309* (2013.01); *G02F 1/136286* (2013.01); *H01L 27/124* (2013.01); *H01L 27/1288* (2013.01); *G02F 2001/134372* (2013.01); *G02F 2001/136218* (2013.01); *G02F 2201/121* (2013.01); *G02F 2201/123* (2013.01)

(58) Field of Classification Search
CPC ........... H01L 29/78633; H01L 27/1288; H01L 27/3244; H01L 27/124; H01L 27/3262; H01L 27/1251; H01L 27/3246; H01L 29/42384; G02F 1/134309; G02F 1/133707; G02F 1/1393; G02F 1/13624; G02F 1/134336; G02F 2001/134354; G02F 2001/134318; G02F 2001/134372; G02F 2201/123; G02F 2201/128
USPC .................................................. 349/139, 142
See application file for complete search history.

(56) References Cited

U.S. PATENT DOCUMENTS

| | | | |
|---|---|---|---|
| 6,710,833 B2 * | 3/2004 | Wang | G02F 1/1393 |
| | | | 349/128 |
| 8,314,914 B2 | 11/2012 | Ko et al. | |
| 8,593,605 B2 | 11/2013 | Lee et al. | |

(Continued)

FOREIGN PATENT DOCUMENTS

| | | |
|---|---|---|
| KR | 1020120081666 A | 7/2012 |
| KR | 1020120097231 A | 9/2012 |
| KR | 1020130101325 A | 9/2013 |

*Primary Examiner* — Roy K Potter
(74) *Attorney, Agent, or Firm* — Cantor Colburn LLP

(57) ABSTRACT

A display device includes a base substrate; a pixel electrode on the base substrate; a first conductive bar which is adjacent to and separated from a first edge of the pixel electrode in a top plan view, the first conductive bar disposed in a same layer as the pixel electrode; and a common electrode which overlaps the pixel electrode. In the top plan view, the first conductive bar includes: a first body which lengthwise extends along the first edge of the pixel electrode and includes an edge which faces the first edge of the pixel electrode, and a first ridge pattern and a second ridge pattern each protruding from the edge of the first body and toward the pixel electrode, the first and second ridge patterns consecutively disposed along a lengthwise direction of the first body.

20 Claims, 27 Drawing Sheets

(56) References Cited

U.S. PATENT DOCUMENTS

| | | | |
|---|---|---|---|
| 8,643,813 B2 | 2/2014 | Lee et al. | |
| 8,854,588 B2 | 10/2014 | Lee et al. | |
| 9,158,164 B2 * | 10/2015 | Tseng | G02F 1/134336 |
| 9,389,470 B1 * | 7/2016 | Tien | G02F 1/136209 |
| 9,568,780 B2 * | 2/2017 | Lee | G02F 1/134309 |
| 2008/0094558 A1 | 4/2008 | Wang et al. | |
| 2009/0201455 A1 * | 8/2009 | Murai | G02F 1/134363 |
| | | | 349/139 |
| 2009/0260738 A1 | 10/2009 | Kitada et al. | |
| 2014/0104547 A1 | 4/2014 | Kuo et al. | |

* cited by examiner

DISPLAY DEVICE AND MASK FOR MANUFACTURING DISPLAY DEVICE

This application claims priority to Korean Patent Application No. 10-2016-0052383, filed on Apr. 28, 2016, and all the benefits accruing therefrom under 35 U.S.C. § 119, the content of which in its entirety is herein incorporated by reference.

BACKGROUND

1. Field

The invention relates to a display device and a mask for manufacturing a display device.

2. Description of the Related Art

Liquid crystal displays ("LCDs") are one of the most widely used types of flat panel displays. Generally, an LCD includes a pair of display substrates having field generating electrodes, such as pixel electrodes and a common electrode, and an optical medium layer such as a liquid crystal layer interposed between the two display substrates. In an LCD, voltages are applied to field generating electrodes to generate an electric field in an optical medium layer such as a liquid crystal layer. Accordingly, directions of liquid crystal molecules of the liquid crystal layer are determined, and polarization of incident light is controlled by the directions of the liquid crystal molecules. As a result, a desired image is displayed on the LCD.

Of LCDs, vertically aligned ("VA") mode LCDs, in which relatively long axes of liquid crystals are aligned perpendicular to upper and lower display substrates when no electric field is applied, are drawing attention due to relatively high contrast ratios and wide standard viewing angles thereof.

To make VA mode LCDs have relatively wide viewing angles, a plurality of domains having different alignment directions of liquid crystals from each other may be disposed or formed in one pixel.

One example method of forming a plurality of domains is to form incision portions, such as slits, in a field generating electrode such as a pixel electrode. In this method, liquid crystals are rearranged by fringe fields formed between edges of the incision portions and the field generating electrode which faces the edges of the incision portions, thereby forming a plurality of domains.

SUMMARY

One or more exemplary embodiment of the invention provides a display device having improved transmittance by controlling fringe fields formed at edges of a pixel electrode.

One or more exemplary embodiment of the invention also provides a display device having improved lateral visibility.

One or more exemplary embodiment of the invention also provides a mask for manufacturing a display device, the mask being employed to manufacture a pixel electrode which can improve transmittance.

Exemplary embodiments of the invention are not restricted to the one set forth herein. The above and other features of the invention will become more apparent to one of ordinary skill in the art to which the invention pertains by referencing the detailed description of the invention given below.

According to an exemplary embodiment of the invention, there is provided a display device. The display device includes a base substrate; a pixel electrode on the base substrate; a first conductive bar which is adjacent to and separated from a first edge of the pixel electrode in a top plan view, the first conductive bar disposed in a same layer as the pixel electrode; and a common electrode which overlaps the pixel electrode. In the top plan view, the first conductive bar includes: a first body which lengthwise extends along the first edge of the pixel electrode and includes an edge which faces the first edge of the pixel electrode, and a first ridge pattern and a second ridge pattern each protruding from the edge of the first body and toward the pixel electrode, the first and second ridge patterns consecutively disposed along a lengthwise direction of the first body.

According to another exemplary embodiment of the invention, there is provided a mask for manufacturing a display device. The mask includes a pixel electrode pattern corresponding to a pixel electrode of the display device; a first conductive bar pattern which corresponds to a first conductive bar of the display device, and is adjacent to and separated from a first edge of the pixel electrode pattern in a top plan view; and a first connecting portion pattern which corresponds to a first connecting portion of the display device and connects the first conductive bar pattern and the pixel electrode pattern to each other. In the top plan view, the first conductive bar pattern includes: a first body pattern which corresponds to a first body of the first conductive bar, lengthwise extends along the first edge of the pixel electrode pattern and includes an edge which faces the first edge of the pixel electrode pattern, and a plurality of first patch patterns which correspond to first ridge patterns of the first conductive bar, and each protrude from the edge of the first body pattern and toward the pixel electrode pattern.

BRIEF DESCRIPTION OF THE DRAWINGS

These and/or other features will become apparent and more readily appreciated from the following description of the embodiments, taken in conjunction with the accompanying drawings in which.

DETAILED DESCRIPTION

Figure 1:
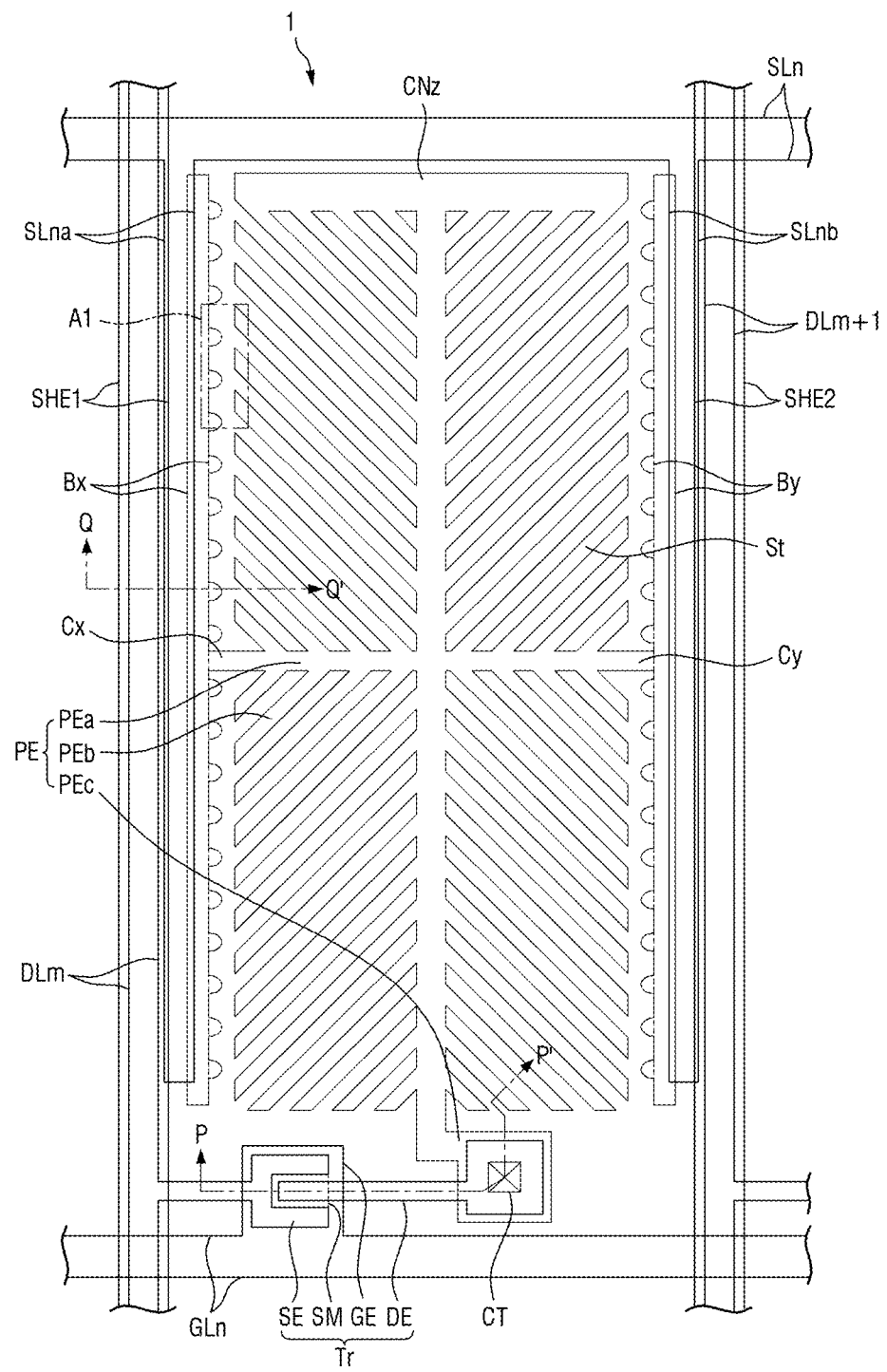
FIG. 1 is a schematic top plan view of an embodiment of a first display substrate included in a display device according to the invention, more specifically, a schematic top plan view illustrating an embodiment of the structure of a pixel.

Features of the invention and methods of accomplishing the same may be understood more readily by reference to the following detailed description of embodiments and the accompanying drawings. The invention may, however, be embodied in many different forms and should not be construed as being limited to the embodiments set forth herein. Rather, these embodiments are provided so that this disclosure will be thorough and complete and will fully convey invention to those skilled in the art, and the invention will only be defined by the appended claims.

The terminology used herein is for the purpose of describing particular embodiments only and is not intended to be limiting of the invention. As used herein, the singular forms "a," "an" and "the" are intended to include the plural forms as well, unless the context clearly indicates otherwise. "At least one" is not to be construed as limiting "a" or "an." "Or" means "and/or." It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

An element located on a "left side" of another element in the figures can be located on a "right side" of the element depending on a point of view. Thus, the exemplary term "below" can encompass both an orientation of above and below, and the exemplary term "left side" can encompass both an orientation of the left side and the right side. The element can be otherwise oriented. In this case, the spatially relative terms used herein may be interpreted accordingly.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Throughout the specification, the same or like elements are identified by the same reference characters.

Hereinafter, embodiments of the invention will be described with reference to the attached drawings.

Figure 2:
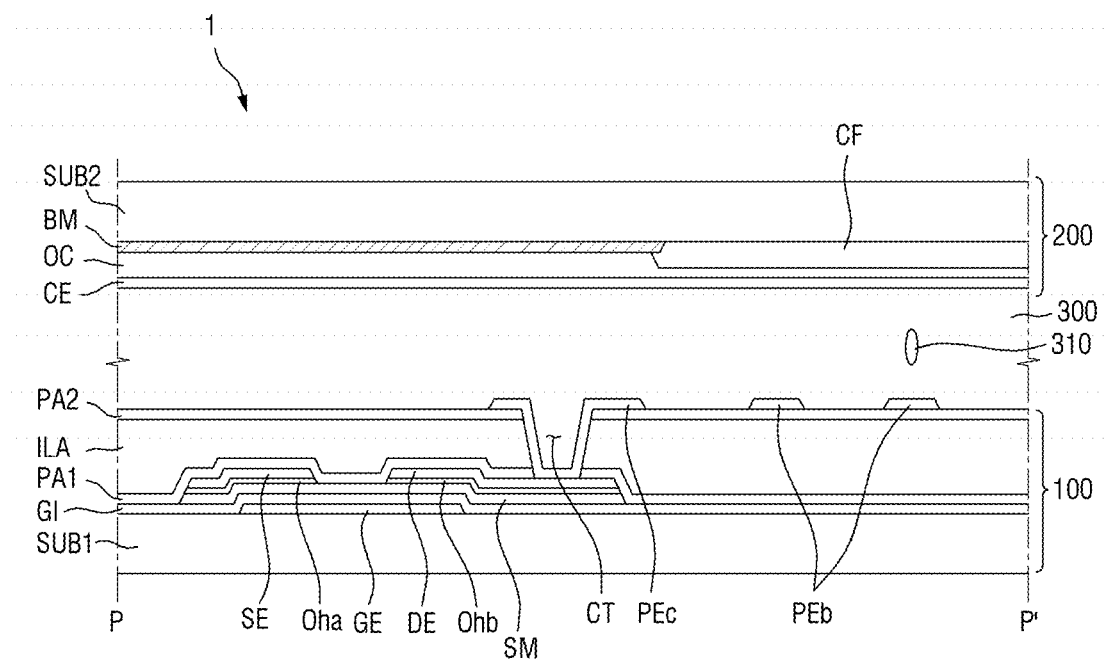
FIG. 2 is a schematic cross-sectional view of the display device including the first display substrate of FIG. 1, taken along line P-P'.
Figure 3:
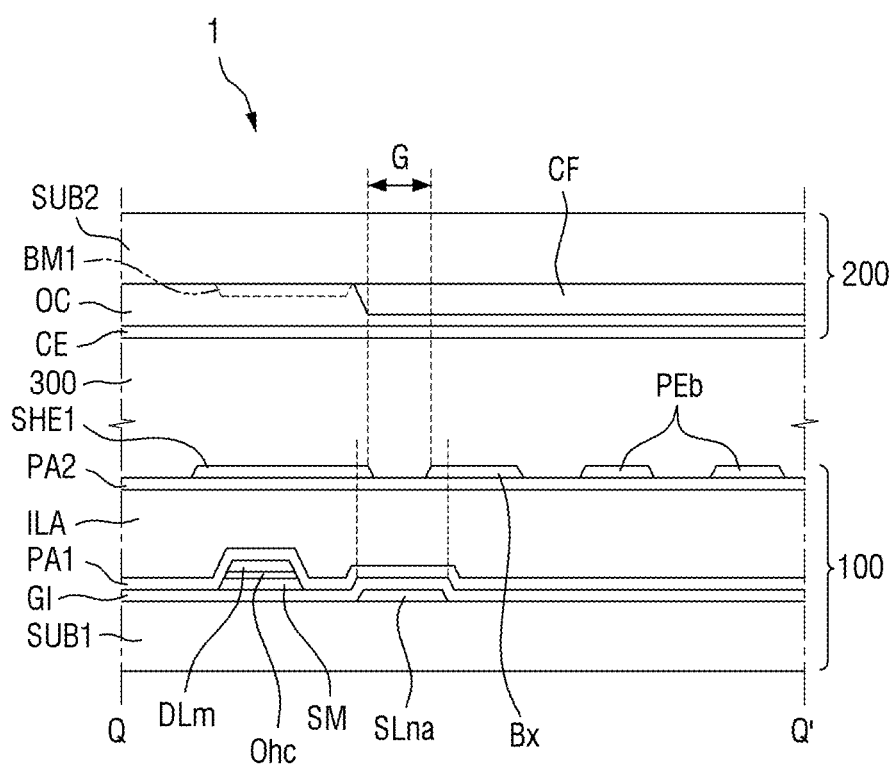
FIG. 3 is a schematic cross-sectional view of the display device including the first display substrate of FIG. 1, taken along line Q-Q'.
Figure 4:
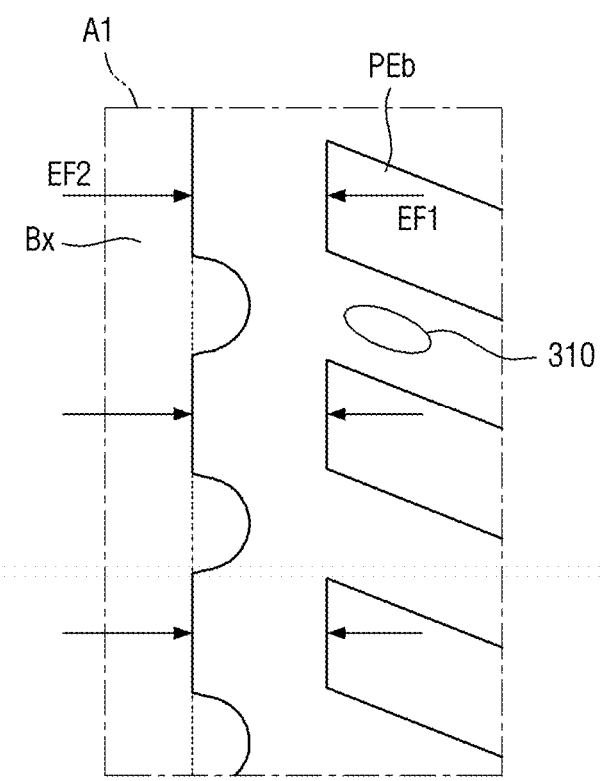
FIG. 4 is an enlarged top view of portion 'A1' of the display device including the first display substrate of FIG. 1.
Figure 5:
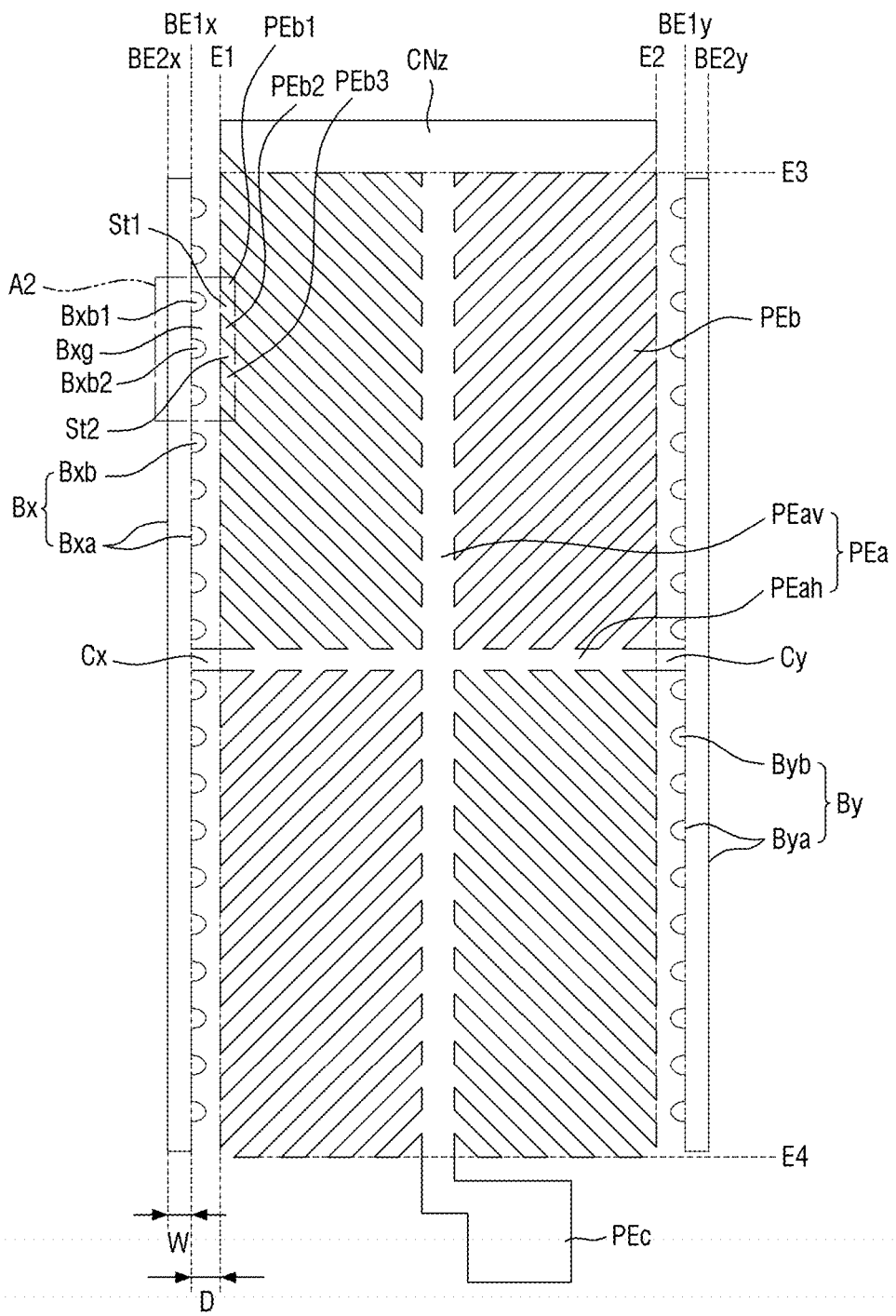
FIG. 5 is a top plan view of an embodiment of a pixel electrode and conductive bars of the display device of FIG. 1.
Figure 6:
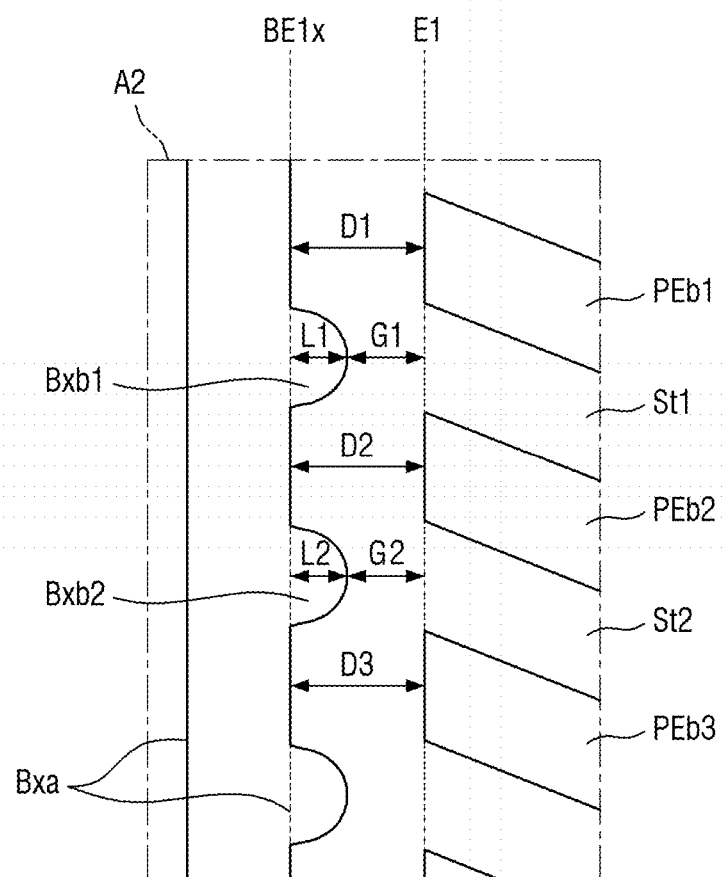
FIG. 6 is an enlarged top plan view of portion 'A2' of FIG. 5.

FIG. 1 is a schematic top plan view of an embodiment of a first display substrate 100 included in a display device 1 according to the invention, more specifically, a schematic top plan view illustrating an embodiment of the structure of a pixel. FIG. 2 is a schematic cross-sectional view of the display device 1 including the first display substrate 100 of FIG. 1, taken along line P-P'. FIG. 3 is a schematic cross-sectional view of the display device 1 including the first display substrate 100 of FIG. 1, taken along line Q-Q'. FIG. 4 is an enlarged top plan view of portion 'A1' of the display device 1 including the first display substrate 100 of FIG. 1. FIG. 5 is a top plan view of an embodiment of a pixel electrode PE and conductive bars Bx and By of FIG. 1. FIG. 6 is an enlarged top view of portion 'A2' of FIG. 5. The elements indicated within the above drawings may each be provided in plurality within the display device 1.

Referring to FIGS. 1 through 6, the display device 1 according to the embodiment may include the first display substrate 100, a second display substrate 200 which faces the first display substrate 100, and an optical medium layer such as a liquid crystal layer 300 which is located between the first display substrate 100 and the second display substrate 200 at inner surfaces thereof. The display device 1 according to the embodiment may further include a pair of polarizers (not illustrated) attached to outer surfaces of the first display substrate 100 and the second display substrate 200.

The first display substrate 100 may be a thin-film transistor ("TFT") substrate in which switching devices (e.g., TFTs) for driving a liquid crystal molecule 310 of the liquid crystal layer 300 are disposed or formed. The second display substrate 200 may be an opposing display substrate which faces the first display substrate 100. The liquid crystal layer 300 may include a plurality of liquid crystal molecules 310 having dielectric anisotropy. When an electric field is formed between and applied between the first display substrate 100 and the second display substrate 200, the liquid crystal molecules 310 may rotate in a certain direction between the first display substrate 100 and the second display substrate 200, thereby transmitting or blocking light incident thereto. Here, the term "rotate" may indicate not only that the liquid crystal molecules 310 actually rotate but also that the arrangement of the liquid crystal molecules 310 is changed by the electric field.

The first display substrate 100 will hereinafter be described.

A first base substrate SUB1 may include an insulating substrate, and the insulating substrate may be transparent. In an embodiment, for example, the first base substrate SUB1 may include a glass substrate, a quartz substrate or a transparent resin substrate. In addition, the first base substrate SUB1 may include polymer or plastic having relatively high thermal resistance. In some embodiments, the first base substrate SUB1 may have flexibility. In some embodiments, the first base substrate SUB1 may collectively include a layer (such as an insulating layer) stacked on an insulating substrate.

A gate line GLn and a gate electrode GE may be located on the first base substrate SUB1. The gate line GLn may transmit and deliver a gate signal, and define a length thereof which extends substantially in a first direction (e.g., a horizontal direction in the drawings). The gate electrode GE may protrude from the gate line GLn and may be connected to the gate line GLn to be defined thereby. The gate line GLn and the gate electrode GE may include or be made of aluminum (Al)-based metal such as aluminum or an aluminum alloy, silver (Ag)-based metal such as silver or a silver alloy, copper (Cu)-based metal such as copper or a copper alloy, molybdenum (Mo)-based metal such as molybdenum or a molybdenum alloy, chrome (Cr), titanium (Ti) or tantalum (Ta).

A gate insulating layer GI may be located on the gate line GLn and the gate electrode GE. The gate insulating layer GI may include or be made of an insulating material. In an embodiment, the gate insulating layer GI may include or be made of an inorganic insulating material such as silicon nitride, silicon oxide or silicon oxynitride. The gate insulating layer GI may have a single layer structure or a multilayer structure including at least two insulating layers with different physical characteristics from each other.

A semiconductor layer SM may be located on the gate insulating layer GI, and a portion of the semiconductor layer SM may overlap the gate electrode GE. The semiconductor layer SM may include amorphous silicon, polycrystalline silicon or an oxide semiconductor.

A plurality of ohmic contact members Oha through Ohc may be located on the semiconductor layer SM. The ohmic contact members Oha through Ohc may include a source ohmic contact member Oha located under a source electrode SE, a drain ohmic contact member Ohb located under a drain electrode DE, and a data ohmic contact member Ohc located under a data line DLm or DLm+1. The ohmic contact members Oha through Ohc may include or be made of n+hydrogenated amorphous silicon relatively heavily doped with an n-type impurity or may include or be made of silicide.

In some embodiments, if the semiconductor layer SM is an oxide semiconductor, the ohmic contact members Oha through Ohc may be omitted.

The source electrode SE, the drain electrode DE and the data line DLm or DLm+1 may be located on the ohmic contact members Oha through Ohc and the gate insulating layer GI. The data line DLm or DLm+1 may transmit and deliver a data voltage, and define a length thereof which extends substantially in a second direction (e.g., a vertical direction in the drawings) intersecting the first direction to cross the gate line GLn. A width of the data line DLm or DLm+1 is smaller than the length thereof and is defined in the first direction. A width of the gate line GLn is smaller than the length thereof and is defined in the second direction. For ease of description, with reference to a top plan view, a data line located on the left side of the pixel electrode PE in the drawings will hereinafter be referred to as a first data line DLm, and a data line located on the right side of the pixel electrode PE will hereinafter be referred to as a second data line DLm+1.

The source electrode SE may be connected to the first data line DLm to be defined thereby, and may protrude from the first data line DLm onto the gate electrode GE. In some embodiments, a portion of the source electrode SE which is located on the gate electrode GE may be bent in a 'C' shape in the top plan view. However, the source SE can have various shapes.

The drain electrode DE faces the source electrode SE with respect to the gate electrode GE. The drain electrode DE may include a bar portion which extends substantially alongside the source electrode SE and an extension portion which is opposite the bar portion. The drain electrode DE and the source electrode SE may contact the semiconductor layer SM and may be separated from each other in the top plan view with respect to the semiconductor layer SM.

The first and second data lines DLm and DLm+1, the source electrode SE and the drain electrode DE may include or be made of aluminum, copper, silver, molybdenum, chrome, titanium, tantalum or an alloy of these metals. In addition, each of the first and second data lines DLm and DLm+1, the source electrode SE and the drain electrode DE may have, but not limited to, a multilayer structure composed of a lower layer (not illustrated) made of refractory metal and an upper layer (not illustrated) made of a material with relatively low resistivity.

The gate electrode GE, the source electrode SE and the drain electrode DE may together form a TFT Tr (e.g., a switching device) together with the semiconductor layer SM. The TFT Tr may also include the ohmic contacts and/or the gate insulating layer GI at the gate electrode GE, the source electrode SE and the drain electrode DE.

A first passivation layer PA1 may be located on the gate insulating layer GI, the semiconductor layer SM, the source electrode SE and the drain electrode DE. The first passivation layer PA1 may include or be made of an organic insulating material or an inorganic insulating material. The first passivation layer PA1 may protect the TFT Tr and reduce or effectively prevent the undesirable introduction of a material contained in an organic layer ILA into the semiconductor layer SM.

The organic layer ILA may be located on the first passivation layer PA1. In some embodiments, the organic layer ILA may planarize an upper surface of the first passivation layer PA1. The organic layer ILA may include an organic material. In some embodiments, the organic material may be a photosensitive organic material.

In some embodiments, the organic layer ILA may be omitted. Alternatively, in some embodiments, the organic layer ILA may be a color filter. In an embodiment, the color filter may display one of three primary colors, e.g., red, green and blue. However, the color filter may also display any color such as one of cyan, magenta, yellow and white. A case where the organic layer ILA is not a color filter will be described below as an example, but the invention is not limited to this case.

A second passivation layer PA2 may be located on the organic layer ILA. The second passivation layer PA2 may include an inorganic insulating material such as silicon oxide, silicon nitride or silicon oxynitride. The second passivation layer PA2 may reduce or effectively prevent the lifting of the organic layer ILA from underlying layers and the undesirable contamination of the liquid crystal layer 300 by a material such as a solvent introduced from the organic layer ILA.

A contact hole CT which partially exposes the drain electrode DE may be disposed or formed in the first passivation layer PA1, the organic layer ILA and the second passivation layer PA2.

The pixel electrode PE may be located on the second passivation layer PA2. The pixel electrode PE may contact the drain electrode DE through and at the contact hole CT. Accordingly, the pixel electrode PE may be electrically connected to the TFT Tr at the contact hole CT. The pixel electrode PE may include or be made of, but not limited to, a transparent conductive material such as indium tin oxide ("ITO"), indium zinc oxide ("IZO"), indium tin zinc oxide ("ITZO") or Al-doped zinc oxide ("AZO"). In some embodiments, the pixel electrode PE may include or be made of a reflective metal such as aluminum, silver, chrome or an alloy of these metals.

The pixel electrode PE may include a stem portion PEa, a branch portion PEb provided in plurality extending outwards from the stem portion PEa, and a protruding portion PEc. A slit St may be defined between each pair of adjacent branch portions PEb. In some embodiments, the pixel electrode PE may further include a branch connecting portion CNz which connects distal ends of some of the branch parts PEb to each other. Any of the portions of the pixel electrode PE may extend to define other portions of the pixel electrode PE.

The stem portion PEa may include a horizontal stem portion PEah defining a length thereof extending substantially in the horizontal direction in the drawings and a vertical stem portion PEav defining a length thereof extending substantially in the vertical direction in the drawings. The stem portion PEa may divide the pixel electrode PE into a plurality of sub-areas, e.g., a plurality of domains. In some embodiments, the horizontal stem portion PEah and the vertical stem portion PEav may intersect each other. Accordingly, when seen from above (e.g., in the top plan view), the stem portion PEa may be cross (+)-shaped. In this case, the pixel electrode PE may be divided into four sub-areas, e.g., four domains by the stem portion PEa.

A plurality of branch parts PEb located in a same sub-area may extend in a same direction, while the plurality of branch parts PEb located in different sub-areas may extend in different directions. In an embodiment, for example, referring to FIGS. 1 and 5, a plurality of branch portions PEb located in an upper right sub-area may each extend obliquely from the stem part PEa in an upper right direction, and a plurality of branch portions PEb located in a lower right sub-area may extend obliquely from the stem portion PEa in a lower right direction. In addition, a plurality of branch portions PEb located in an upper left sub-area may extend obliquely from the stem portion PEa in an upper left direction, and a plurality of branch portions PEb located in a lower left sub-area may extend obliquely from the stem portion PEa in a lower left direction.

Alternatively, in some embodiments, the stem portion PEa may have various shapes in the top plan view. In this case, the pixel electrode PE may be divided into one sub-area, two sub-areas, or three sub-areas according to the shape of the stem portion PEa. Various structures of the pixel electrode PE will be described in greater detail later with reference to FIGS. 11 through 20.

The protruding portion PEc is provided for connection of the pixel electrode PE to another layer of the display device 1, and may protrude downward in the top plan view from the stem portion PEa or the branch portions PEb. In the drawings, the protruding portion PEc protrudes from the stem portion PEa. However, the protruding portion PEc may not necessarily protrude from the stem portion PEa. The protruding portion PEc may be electrically and physically connected to the drain electrode DE via or at the contact hole CT.

The branch connecting portion CNz may connect distal ends of at least some of the branch parts PEb to each other, at an edge of the pixel electrode PE which does not face the conductive bars Bx and By which will be described later. For ease of description, edges of the pixel electrode PE which face the conductive bars Bx and By will be referred to as a first edge E1 and a second edge E2, respectively, and an upper edge of the pixel electrode PE will be referred to as a third edge E3, and a lower edge of the pixel electrode PE will be referred to as a fourth edge E4. An edge of the pixel electrode PE may be defined as a virtual line (shown as dotted lines in the drawings) common to distal end surfaces of a group of branch portions PEb. In this case, the branch connecting portion CNz may connect distal ends of branch portions PEb located at the third edge E3 which does not face the conductive bars Bx and By. Alternatively, unlike in FIGS. 1 and 5, the branch connecting portion CNz may further be disposed at the fourth edge E4 to connect distal ends of branch portions PEb located at the fourth edge E4. In some embodiments, the branch connecting portion CNz may be omitted.

Distal ends of branch portions PEb of the pixel electrode PE which face the conductive bars Bx and By may not be connected to each other. In an embodiment, for example, referring to FIGS. 1 and 5, distal ends of some of the branch portions PEb which face the conductive bars Bx and By may not be connected to each other.

In FIG. 1, a horizontal (first direction) width of the pixel electrode PE, that is, a width of the pixel electrode PE in a direction in which the gate line GLn lengthwise extends is smaller than a vertical (second direction) width of the pixel electrode PE, that is, a width of the pixel electrode PE in a direction in which the first and second data lines DLm and DLm+1 lengthwise extend. However, this is merely an example. In some embodiments, the horizontal width of the pixel electrode PE, that is, the width of the pixel electrode PE in the extending direction of the gate line GLn may be greater than the vertical width of the pixel electrode PE, that is, the width of the pixel electrode PE in the extending direction of the first and second data lines DLm and DLm+1.

The conductive bars Bx and By and connecting portions Cx and Cy may be located on the second passivation layer PA2. The conductive bars Bx and By may be physically separated from the pixel electrode PE and located in a same layer as the pixel electrode PE. More particularly, the conductive bars Bx and By may be physically separated from the edge of the pixel electrode PE which respectively faces the conductive bars Bx and By. In an embodiment, like the pixel electrode PE, the conductive bars Bx and By and the connecting portions Cx and Cy may be located directly on the second passivation layer PA2 to directly contact the second passivation layer PA2, but the invention is not limited thereto.

The conductive bars Bx and By are bar-shaped conductors extending along the vertical direction or the horizontal direction, and control electric fields generated at edges of the pixel electrode PE. Each of the conductive bars Bx and By may extend along an entire length of a respective edge of the pixel electrode PE. Each of the conductive bars Bx and By is placed to face an edge of the pixel electrode PE and extends parallel to the edge of the pixel electrode PE faced thereby, with a gap between them. In an embodiment, the conductive bars Bx and By may define a length thereof which extends along the extending direction of the first and second data lines DLm and DLm+1, that is, the vertical direction in the drawings. The conductive bars Bx and By do not overlap the first and second data lines DLm and DLm+1. For ease of description, a conductive bar located on the left side of the pixel electrode PE, that is, a conductive bar which faces the first edge E1 of the pixel electrode PE will be referred to as a first conductive bar Bx, and a conductive bar which faces the second edge E2 of the pixel electrode PE will be referred to as a second conductive bar By.

The first conductive bar Bx may include a first body Bxa and a ridge pattern Bxb provided in plurality. The first body Bxa may define a length thereof which extends along the first edge E1 in the vertical direction. The ridge patterns Bxb may be located at an edge of the first body Bxa which faces the first edge E1 and protrude from the edge of the first body Bxa toward the pixel electrode PE. Either of the first body Bxa or the ridge pattern Bxb may be considered as extending to define the other one of the first body Bxa or the ridge pattern Bxb. The same may be applied to other conductive bars and portions thereof.

Like the first conductive bar Bx, the second conductive bar By may include a second body Bya and a ridge pattern Byb provided in plurality. The second body Bya may define a length thereof which extends along the second edge E2 in the vertical direction. The ridge patterns Byb may be located at an edge of the second body Bya which faces the second edge E2 and protrude from the edge of the second body Bya toward the pixel electrode PE.

In the display device 1 according to the embodiment, since each of the first and second conductive bars Bx and By includes the ridge patterns Bxa or Bxb, a respective space between each of the first and second conductive bars Bx and By, and the pixel electrode PE, can be reduced. Accordingly, the formation of a dark portion in the space between each of the first and second conductive bars Bx and By, and the pixel electrode PE, can be reduced or effectively prevented, thereby increasing transmittance.

A gap between a respective edge of the pixel electrode PE and the first body Bxa and a gap between a respective edge of the pixel electrode PE and the second body Bya may be constant or variable. For ease of description, an edge of the first body Bxa which faces the first edge E1 of the pixel electrode PE will be referred to as a first inner edge BE1x, and an edge of the first body Bxa which is located opposite the first inner edge BE1x will be referred to as a first outer edge BE2x. The first inner edge BE1x is defined common to bases of the ridge portions Bxb protruding from the first body Bxa. The same may be applied to other conductive bars. An edge of the second body Bya which faces the second edge E2 of the pixel electrode PE will be referred to as a second inner edge BE1y, and an edge of the second body Bya which is located opposite the second inner edge BE1y will be referred to as a second outer edge BE2y.

In some embodiments, as illustrated in FIGS. 1 and 5, a distance D between the first edge E1 of the pixel electrode PE and the first inner edge BE1x of the first body Bxa may be constant. The distance D may be adjusted in view of visibility of the display device 1. In an example, the distance D may be in the range of about 2 micrometers (μm) to about 5 μm. Likewise, a distance between the second edge E2 of the pixel electrode PE and the second inner edge BE1y of the second body Bya may be constant and may be in the range of about 2 μm to about 5 μm.

A width W of each of the first body Bxa and the second body Bya may be greater than 0 μm and smaller than about 10 μm.

The ridge patterns Bxb of the first conductive bar Bx may face open ends of slits St of the pixel electrode PE which face the first conductive bar Bx, and the ridge patterns Byb of the second conductive bar By may face open ends of slits St of the pixel electrode PE which face the second conductive bar By. Distal ends of the ridge patterns may face the respective open ends of the slits St. Accordingly, where ridge patterns face the respective open ends of the slits St, a short circuit between a conductive bar and the branch parts PEb of the pixel electrode PE may be reduced or effectively prevented, in the manufacturing process.

Of the ridge patterns Bxb of the first conductive bar Bx, two ridge patterns disposed side by side with each other (e.g., consecutively) along the direction (or the vertical direction in the drawings) in which the first conductive bar Bx extends will be referred to as a first ridge pattern Bxb1 and a second ridge pattern Bxb2, respectively. A groove pattern Bxg may be defined between and by the first ridge pattern Bxb1 and the second ridge pattern Bxb2, with the first inner edge BE1x.

Of the slits St of the pixel electrode PE, a slit which faces the first ridge pattern Bxb1 will be referred to as a first slit St1, and a slit which faces the second ridge pattern Bxb2 will be referred to as a second slit St2. The first slit St1 may be defined between a first branch portion PEb1 and a second branch portion PEb2 which are arranged side by side with each other (e.g., consecutively) along the vertical direction among the branch portions PEb of the pixel electrode PE. The second branch portion PEb2 may face the groove pattern Bxg defined between the first ridge pattern Bxb1 and the second ridge pattern Bxb2. Similarly, the second slit St2 may be defined between the second branch portion PEb2 and a third branch portion PEb3 which are arranged side by side with each other along the vertical direction among the branch portions PEb of the pixel electrode PE.

As described above, in the display device 1 according to the embodiment, the distance D between the first edge E1 of the pixel electrode PE and the first inner edge BE1x of the first body Bxa may be constant. Therefore, a first shortest distance D1 between the first branch portion PEb1 and the first body Bxa may be substantially equal to a second shortest distance D2 between the second branch portion PEb2 and the first body Bxa. In addition, a third shortest distance D3 between the third branch portion PEb3 and the first body Bxa may be substantially equal to the first shortest distance D1 and the second shortest distance D2.

A distance from the first inner edge BEx1 of the first body Bxa to a distal end of the first ridge pattern Bxb1, that is, a protruding length L1 of the first ridge pattern Bxb1 may be substantially equal to a protruding length L2 of the second ridge pattern Bxb2. In addition, a shortest distance G1 between the first ridge pattern Bxb1 and the first edge E1 of the pixel electrode PE may be substantially equal to a shortest distance G2 between the second ridge pattern Bxb2 and the first edge E1 of the pixel electrode PE.

The first and second conductive bars Bx and By may not overlap the first and second data lines DLm and DLm+1. In an embodiment, for example, the first conductive bar Bx may be located between the first edge E1 of the pixel electrode PE and the first data line DLm and may not overlap the first data line DLm. In addition, the second conductive bar By may be located between the second edge E2 of the pixel electrode PE and the second data line DLm+1 and may not overlap the second data line DLm+1.

The connecting portion Cx and Cy electrically connect the pixel electrode PE, and the first and second conductive bars Bx and By to each other, respectively. One of the conductive bars Bx and By, the connecting portions Cx and Cy and the pixel electrode PE may extend to define another one of the conductive bars Bx and By, the connecting portions Cx and Cy and the pixel electrode PE. In an embodiment, the connecting portions Cx and Cy may include a first connecting portion Cx which connects the first conductive bar Bx and the pixel electrode PE to each other and a second connecting portion Cy which connects the second conductive bar By and the pixel electrode PE to each other. In some embodiments, the first connecting portion Cx may connect the stem portion PEa of the pixel electrode PE and the first conductive bar Bx to each other, and the second connecting portion Cy may connect the stem portion PEa of the pixel electrode PE and the second conductive bar By to each other. However, the number and position of the connecting portions Cx and Cy can be changed.

The first and second conductive bars Bx and By and the first and second connecting portions Cx and Cy may include or be made of a transparent conductive material or a reflective metal such as aluminum, silver, chrome or an alloy of these metals. In addition, the first and second conductive bars Bx and By and the first and second connecting portion Cx and Cy may include or be made of the same material as the pixel electrode PE. In an embodiment of manufacturing a display device, the first and second conductive bars Bx and By, the first and second connecting portions Cx and Cy and the pixel electrode PE may be formed simultaneously in the same process using one photomask. The first and second conductive bars Bx and By, the first and second connecting portions Cx and Cy and the pixel electrode PE may be formed from a same material layer in the same process using one photomask.

Shielding electrodes SHE1 and SHE2 may be located on the second passivation layer PA2. The shielding electrodes SHE1 and SHE2 may be physically separated and electrically insulated from the first and second conductive bars Bx and By and the pixel electrode PE. The shielding electrodes SHE1 and SHE2 may be located in the same layer as the first and second conductive bars Bx and By and the pixel electrode PE. In an embodiment, like the first and second conductive bars Bx and By and the pixel electrode PE, the shielding electrodes SHE1 and SHE2 may be located directly on the second passivation layer PA2 to directly contact the second passivation layer PA2, but the invention is not limited thereto. The shielding electrodes SHE1 and SHE2 may include or be made of the same material as the first and second conductive bars Bx and By and the pixel electrode PE. In an embodiment of manufacturing a display device, the shielding electrodes SHE1 and SHE2, the first and second conductive bars Bx and By and the pixel electrode PE may be formed simultaneously in the same process using one photomask. The shielding electrodes SHE1 and SHE2, the first and second conductive bars Bx and By, the first and second connecting portions Cx and Cy and the pixel electrode PE may be formed from a same material layer in the same process using one photomask.

The shielding electrodes SHE1 and SHE2 may be located on the second passivation layer PA2 at positions corresponding to the first and second data lines DLm and DLm+1 and overlap the first and second data lines DLm and DLm+1, respectively. That is, the shielding electrodes SHE1 and SHE2 may be disposed above the first and second data lines DLm and DLm+1 to be insulated from the first and second data lines DLm and DLm+1 and may overlap the first and second data lines DLm and DLm+1. The shielding electrodes SHE1 and SHE2 may define a length thereof which extends along the direction (e.g., the vertical direction) in which the first and second data lines DLm and DLm+1 extend. For ease of description, a shielding electrode which overlaps the first data line DLm will be referred to as a first shielding electrode SHE1, and a shielding electrode which overlaps the second data line DLm+1 will be referred to as a second shielding electrode SHE2.

When seen from above, a horizontal width of the first shielding electrode SHE1, that is, a width of the first shielding electrode SHE1 in the direction in which the gate line GLn extends may be greater than a horizontal width of the first data line DLm. Likewise, a horizontal width of the second shielding electrode SHE2, that is, a width of the second shielding electrode SHE2 in the direction in which the gate line GLn extends may be greater than a horizontal width of the second data line DLm+1. In addition, when seen from above (e.g., in the top plan view), the first shielding electrode SHE1 may cover the first data line DLm, and the second shielding electrode SHE2 may cover the second data line DLm+1.

In some embodiments, a voltage the same level as a common voltage Vcom applied to a common electrode CE which will be described later may be applied to the first and second shielding electrodes SHE1 and SHE2. Alternatively, in some embodiments, a voltage the same level as a storage voltage Vc applied to a storage electrode line SLn which will be described later may be applied to the first and second shielding electrodes SHE1 and SHE2.

The storage electrode line SLn may further be located on the first base substrate SUB1. The storage electrode line SLn may define a length thereof which extends in substantially the same direction (e.g., the horizontal direction) as the gate line GLn. The storage electrode line SLn may include a first storage electrode SLna and a second storage electrode SLnb. The first storage electrode SLna and the second storage electrode SLnb may shield or reduce a coupling electric field respectively between the first and second data lines DLm and DLm+1 and the pixel electrode PE.

The storage electrode line SLn may at least partially overlap the first and second conductive bars Bx and By. In some embodiments, the first storage electrode SLna of the storage electrode line SLn may overlap the first conductive bar Bx. When seen from above (e.g., the top plan view), the first storage electrode SLna may be located between the first shielding electrode SHE1 and the first conductive bar Bx and may overlap the first conductive bar Bx to cover a space G between the first shielding electrode SHE1 and the first conductive bar Bx. In addition, the first storage electrode SLna which overlaps the first conductive bar Bx may partially overlap the first shielding electrode SHE1. The first storage electrode SLna may not overlap the pixel electrode PE, more specifically, may not overlap the first edge E1 of the pixel electrode PE.

Similarly, the second storage electrode SLnb may overlap the second conductive bar By, may partially overlap the second shielding electrode SHE2, and may not overlap the pixel electrode PE.

In an embodiment, the storage electrode line SLn may be located in the same layer as the gate line GLn and the gate electrode GE and may include or be made of the same material as the gate line GLn and the gate electrode GE. In an embodiment of manufacturing a display device, the storage electrode line SLn and the storage electrodes thereof may be formed from a same material layer as the gate line GLn and the gate electrode GE. Alternatively, in some embodiments, the storage electrode line SLn may be located in the same layer as the first and second data lines DLm and DLm+1 and may include or be made of the same material as the first and second data lines DLm and DLm+1, unlike in the drawings. In an embodiment of manufacturing a display device, the storage electrode line SLn and the storage electrodes thereof may be formed from a same material layer as the first and second data lines DLm and DLm+1. For ease of description, a case where the storage electrode line SLn is located in the same layer as the gate line GLn will be described below.

The second display substrate 200 will hereinafter be described. The second display substrate 200 may include a second base substrate SUB2, a light-blocking member BM, a color filter CF, an overcoat layer OC and the common electrode CE.

Like the first base substrate SUB1, the second base substrate SUB2 may be a transparent insulating substrate. In addition, the second base substrate SUB2 may include polymer or plastic having relatively high thermal resistance. In some embodiments, the second base substrate SUB2 may have flexibility. The light-blocking member BM and BM1 may be located on a surface of the second base substrate SUB2 which faces the first base substrate SUB1. In some embodiments, the light-blocking member BM may include a portion which overlaps the gate line GLn and the TFT Tr and a portion BM1 which overlaps the first and second data lines DLm and DLm+1. As an element that reduces or effectively prevents the leakage of light, the light-blocking member BM and BM1 is also called a "black matrix." The light-blocking member BM and BM1 may include a light-blocking pigment such as black carbon or an opaque material such as chrome (Cr). In some embodiments, the portion BM1 of the light-blocking member BM which overlaps the first and second data lines DLm and DLm+1 can be omitted.

The color filter CF may provide color to light incident thereto to display one of three primary colors, e.g., red, green and blue. However, the color filter CF may not necessarily display one of the three primary colors of red, green and blue and may also display any one of cyan, magenta, yellow and white. In some other embodiments, if the organic layer ILA includes chromatic pigments, the color filter CF can be omitted.

The overcoat layer OC may be disposed or formed on the second base substrate SUB2, the light-blocking member BM and the color filter CF and may cover the light-blocking member BM. The overcoat layer OC may reduce or remove steps (e.g., height differences) formed by the light-blocking member BM and the color filter CF. In some embodiments, the overcoat layer OC may be omitted.

The common electrode CE which overlaps the pixel electrode PE may be located on the overcoat layer OC. The common electrode CE may include or be made of a transparent conductive material such as ITO or IZO. In some embodiments, the common electrode CE may be disposed or formed extended over the entire surface of the second base substrate SUB2 in the shape of a whole plate. The common voltage Vcom may be applied to the common electrode CE. Therefore, the common electrode CE may form an electric field together with the pixel electrode PE.

The pixel electrode PE may receive a data voltage through the TFT Tr, and the common electrode CE may receive the common voltage Vcom at a different level from that of the data voltage. Accordingly, an electric field of a magnitude corresponding to a potential difference between the common voltage Vcom and the data voltage may be formed between the pixel electrode PE and the common electrode CE. The arrangement of the liquid crystal molecules 310 in the liquid crystal layer 300 may be changed according to the magnitude of the electric field, thereby controlling the light transmittance of the display device 1.

Although not illustrated in the drawings, an alignment layer may be located on an inner surface of each of the first display substrate 100 and the second display substrate 200. The alignment layers may be vertical alignment layers. In some embodiments, at least one of the alignment layers may be omitted.

An optical medium layer such as the liquid crystal layer 300 may be located between the first display substrate 100 and the second display substrate 200. The liquid crystal layer 300 may include the liquid crystal molecules 310 having dielectric anisotropy. In some embodiments, the dielectric anisotropy may be negative dielectric anisotropy. The liquid crystal molecules 310 may be pre-tilted such that their long axes are roughly parallel to a lengthwise direction (the extending direction) of the branch portion PEb of the pixel electrode PE. In a state where no electric field is applied to the liquid crystal layer 300, the liquid crystal molecules 310 may be aligned perpendicular to a surface of each of the first display substrate 100 and the second display substrate 200. The liquid crystal layer 300 may further include an alignment agent including reactive mesogen. The alignment agent may cause the liquid crystal molecules 310 to be pre-tilted roughly parallel to the lengthwise direction (the extending direction) of the branch portions PEb.

In an embodiment, the alignment agent may be included in the alignment layers. In this case, each of the alignment layers may include a main chain and side chains. The alignment agent may form the side chains of the alignment layer and have negative dielectric anisotropy. The liquid crystal molecules 310 may be pre-tilted by the side chains to be roughly parallel to the lengthwise direction (the extending direction) of the branch portions PEb.

The operation of the display device 1 will hereinafter be described. When a gate signal is transmitted to and transmitted through the gate line GLn, the TFT Tr (e.g., a switching device) connected to the gate line GLn is turned on. Then, a data voltage applied to and transmitted through the first data line DLm is applied to the pixel electrode PE via the turned-on TFT Tr. The pixel electrode PE which receives the data voltage generates an electric field together with the common electrode CE which received the common voltage Vcom. In response to the generated electric field, the liquid crystal molecules 310 of the liquid crystal layer 300 are oriented such that their long axes are perpendicular to the direction of the electric field.

An electric field in the vertical direction (or a vertical electric field) may be formed between the pixel electrode PE and the common electrode CE, and a fringe field may be formed between adjacent branch portions PEb. A fringe field may also be formed between an inner edge of a conductive bar and the common electrode CE The fringe field may cause the liquid crystal molecules 310 to be arranged in a certain direction and ultimately tilted in a direction roughly parallel to the lengthwise direction of the branch portions PEb.

At an edge of the pixel electrode PE at which distal ends of branch portions PEb are not connected to each other, horizontal components EF1 of a fringe field formed between the ends of the branch parts PEb and the common electrode CE act in a direction roughly perpendicular to distal edges of the branch portion PEb. In addition, horizontal components EF2 of a fringe field formed between the first inner edge BE1x of the first conductive bar Bx and the common electrode CE act in a direction roughly perpendicular to the lengthwise direction of the first conductive bar Bx, that is, in a direction roughly opposite to the direction of the horizontal components EF1 of the fringe field formed by the branch parts PEb. The horizontal components EF1 of the fringe field formed by the edges of the branch portions PEb may be offset by the horizontal components EF2 of the fringe field formed by the first inner edge BE1x of the first conductive bar Bx. In addition, the first and second conductive bars Bx and By may block an external electric field. Therefore, scattering of the arrangement direction of the liquid crystal molecules 310 at an edge of the pixel electrode PE may be reduced or effectively prevented, and the liquid crystal molecules 310 at the branch portions PEb can be arranged roughly parallel to the lengthwise direction of the branch portions PEb at the edge of the pixel electrode PE. Accordingly, this can increase transmittance at the edge of the pixel electrode PE.

As the respective space between each of the first and second conductive bars Bx and By and the pixel electrode PE increases, a dark portion may be formed in the space, thereby reducing the transmittance of a display device. However, in one or more embodiment of the display device 1 according to the invention, each of the first and second conductive bars Bx and By includes the ridge patterns Bxb or Byb which respectively protrude toward the pixel electrode PE. Therefore, the space between each of the first and second conductive bars Bx and By, and the pixel electrode PE, may be reduced. Accordingly, the formation of a dark portion in the space between each of the first and second conductive bars Bx and By, and the pixel electrode PE, may be reduced, thereby further improving transmittance at the edges of the pixel electrode PE.

In addition, a voltage at the same level as the common voltage Vcom may be applied to the first and second shielding electrodes SHE1 and SHE2. Therefore, no electric field may be formed between the common electrode CE and each of the first and second shielding electrodes SHE1 and SHE2. Even if an electric field is formed between the common electrode CE and each of the first and second shielding electrodes SHE1 and SHE2, the intensity of the electric field may be relatively very low as compared to that formed between the pixel electrode PE and the common electrode CE. Therefore, the probability that liquid crystal molecules 310 located in areas adjacent to the first and second data lines DLm and DLm+1 will be misarranged is reduced, and the leakage of light due to the misarrangement of the liquid crystal molecules 310 near the first and second data lines DLm and DLm+1 is reduced. In addition, a planar area of the light-blocking member BM can be reduced further, and an aperture ratio of the display device 1 can be increased.

Figure 7:
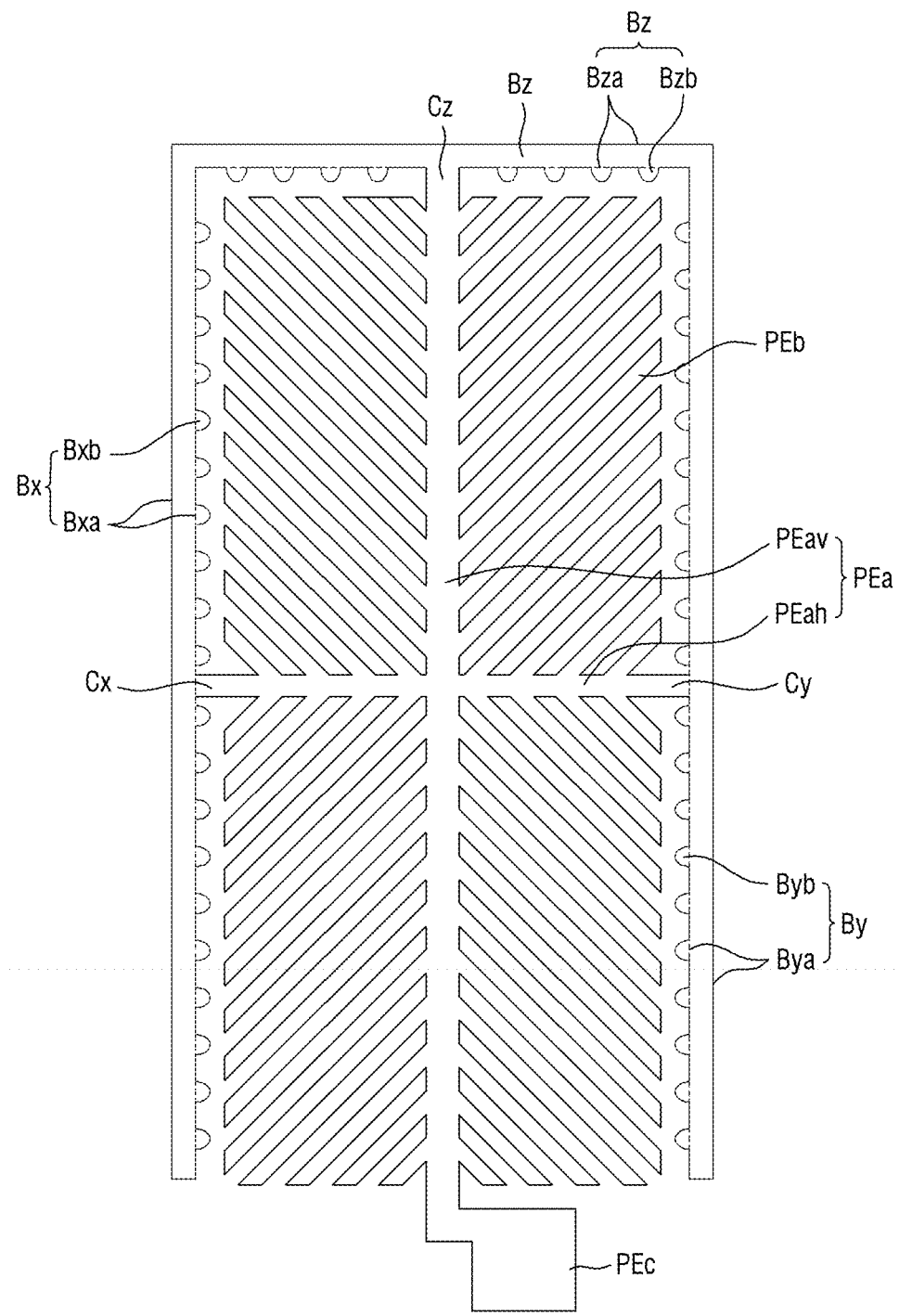
FIG. 7 illustrates another embodiment of the pixel electrode and the conductive bars of the display device of FIG. 1

FIG. 7 illustrates another embodiment of the pixel electrode PE and the conductive bars Bx and By of the display device 1 of FIG. 1.

Referring to FIGS. 1, 5 and 7, the embodiment of FIG. 7 may be substantially the same as the embodiment of FIG. 5 except that a pixel electrode PE does not include a branch connecting part located at a third edge E3 and that the embodiment of FIG. 7 further includes a third conductive bar Bz which faces the third edge E3 of the pixel electrode PE and is separated from the pixel electrode PE and a third connecting portion Cz which connects the pixel electrode PE and the third conductive bar Bz to each other. The third conductive bar Bz also does not overlap the first and second data lines DLm and DLm+1.

The third conductive bar Bz may be connected a first conductive bar Bx and/or a second conductive bar By. One of the first to third conductive bars Bx, By and Bz may extend to define another among the first to third conductive bars Bx, By and Bz. As illustrated in FIG. 7, the third conductive bar Bz may be connected to both the first conductive bar Bx and the second conductive bar By. In this case, any one of a first connecting portion Cx, a second connecting portion Cy and the third connecting portion Cz can be omitted.

Like the first conductive bar Bx and the second conductive bar By, the third conductive bar Bz may include a third body Bza which lengthwise extends along the third edge E3 and a ridge pattern Bzb provided in plurality located at a side of the third body Bza which faces the third edge E3 and protrudes from an inner edge of the third body Bza toward the pixel electrode PE.

Figure 8:
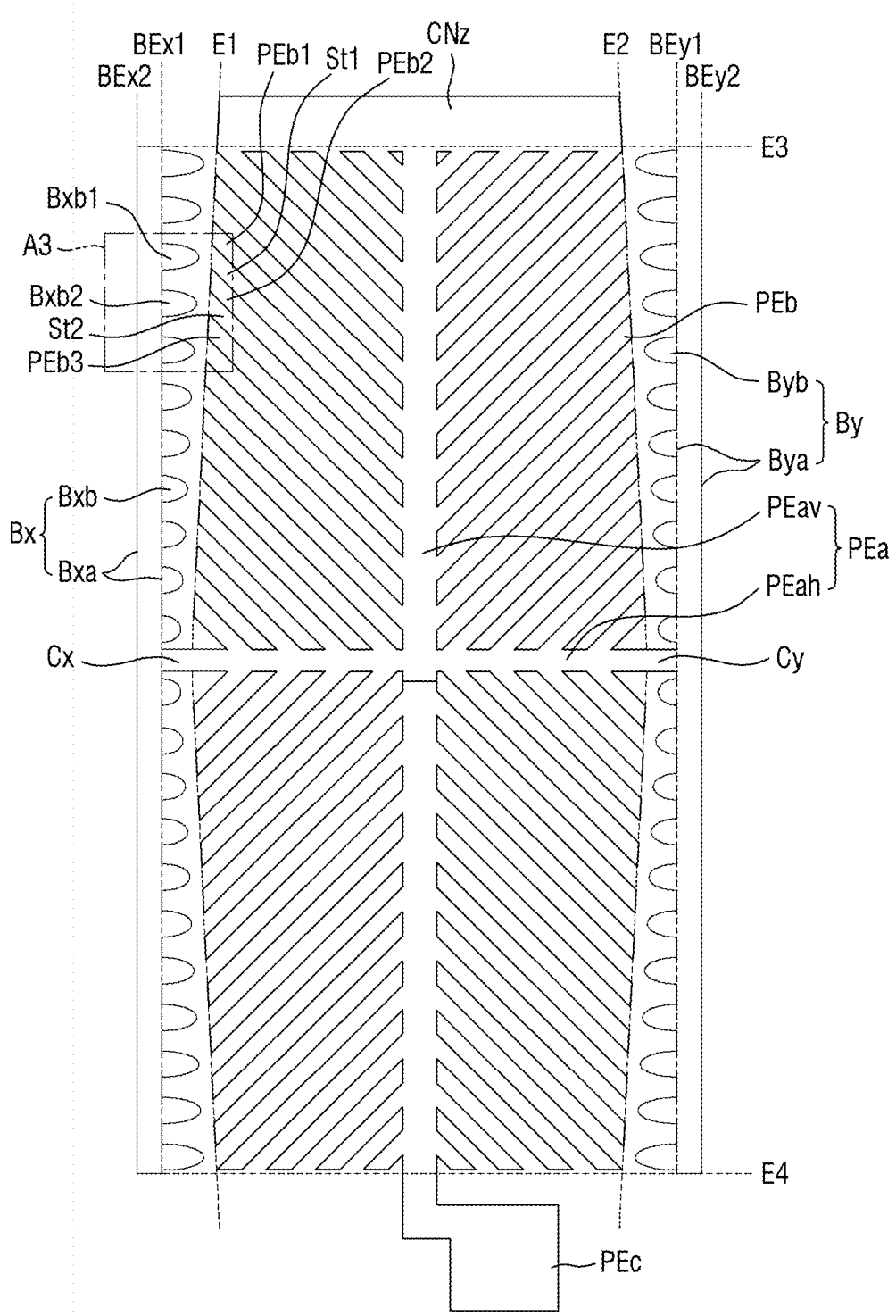
FIG. 8 illustrates still another embodiment of the pixel electrode and the conductive bars of the display device of FIG. 1
Figure 9:
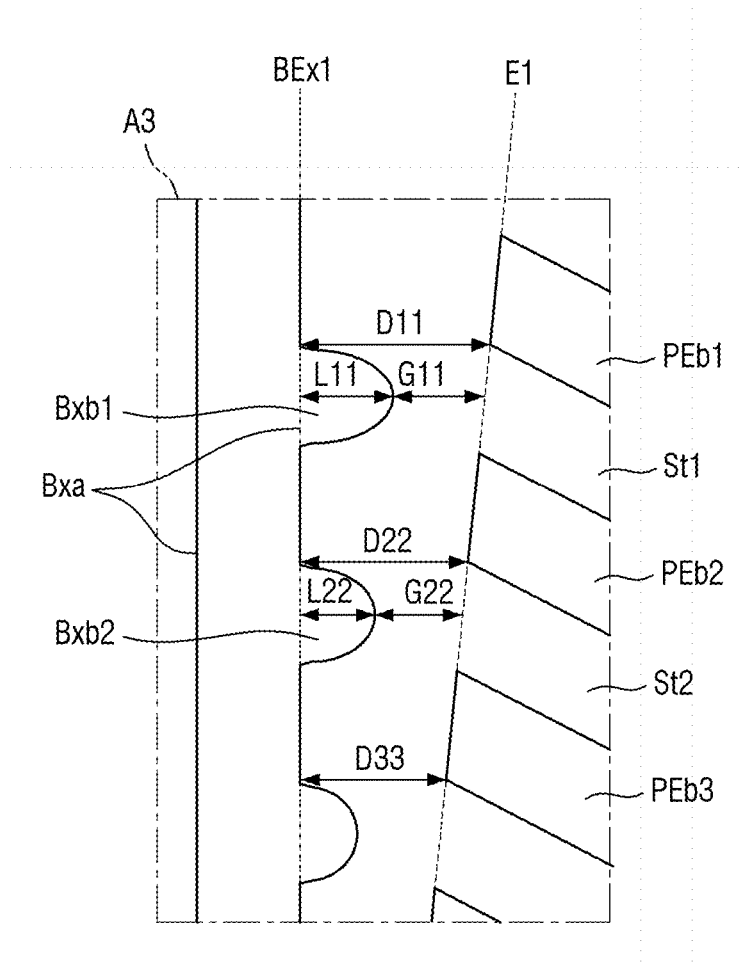
FIG. 9 is an enlarged view of portion 'A3' of FIG. 8.

FIG. 8 illustrates still another embodiment of the pixel electrode PE and the conductive bars Bx and By of the display device 1 of FIG. 1. FIG. 9 is an enlarged view of portion 'A3' of FIG. 8.

Referring to FIGS. 1, 5, 6, 8 and 9, the embodiment of FIGS. 8 and 9 is different from the embodiment of FIGS. 1, 5 and 6 in that a distance between an edge of a pixel electrode PE and each of first and second bodies Bxa and Bya of first and second conductive bars Bx and By varies along a lengthwise direction of the first or second body Bxa or Bya. For ease of description, an edge of the first body Bxa which faces the first edge E1 of the pixel electrode PE will be referred to as a first inner edge BEx1, and an edge of the first body Bxa which is located opposite the first inner edge BEx1 will be referred to as a first outer edge BEx2. Similarly, an edge of the second body Bya which faces the second edge E2 of the pixel electrode PE will be referred to as a second inner edge BEy1, and an edge of the second body Bya which is located opposite the second inner edge BEy1 will be referred to as a first outer edge BEy2.

In an embodiment, for example, as for the relationship between first through third branch portions PEb1 through PEb3 arranged side by side with each other along the vertical direction and the first body Bxa, a shortest distance D11 between the first branch portion PEb1 and the first body Bxa may be greater than a shortest distance D22 between the second branch portion PEb2 and the first body Bxa. In addition, a third shortest distance D33 between the third branch portion PEb3 and the first body Bxa may be smaller than the first shortest distance D11 and the second shortest distance D22. That is, a distance between a first edge E1 of the pixel electrode PE and a first inner edge BEx1 of the first body Bxa may vary along a lengthwise direction of the first body Bxa.

As described above, a first ridge pattern Bxb1 may face an open end of a first slit St1, and a second ridge pattern Bxb2 may face an open end of a second slit St2.

A distance from the first inner edge BEx1 of the first body Bxa to an end of the first ridge pattern Bxb1, that is, a protruding length L11 of the first ridge pattern Bxb1 may be greater than a protruding length L22 of the second ridge pattern Bxb2. That is, as the distance between the first edge E1 of the pixel electrode PE and the first inner edge BEx1 of the first body Bxa varies along the lengthwise direction of the first body Bxa, the protruding length of each ridge pattern Bxb may also vary along the lengthwise direction of the first body Bxa.

In some embodiments, a shortest distance G11 between the first ridge pattern Bxb1 and the first edge E1 of the pixel electrode PE may be substantially equal to a shortest distance G22 between the second ridge pattern Bxb2 and the first edge E1 of the pixel electrode PE. That is, even if the distance between the first edge E1 of the pixel electrode PE and the first inner edge Bex1 of the first body Bxa varies along a direction in which the first body Bxa extends, since the protruding lengths of the ridge patterns Bxb vary along the extending direction of the first body Bxa, the shortest distance between the first conductive bar Bx and the pixel electrode PE may be substantially constant along the extending direction of the first body Bxa.

That is, in the embodiment, the respective distance between an edge of the pixel electrode PE and each of the first and second bodies Bxa and Bxb of the first and second conductive bars Bx and By can be changed by modifying the planar shape of the pixel electrode PE. Accordingly, texture that can be generated in the display device 1 can be controlled. Furthermore, since the protruding lengths of the ridge patterns Bxb or Byb are adjusted according to the distance between the edge of the pixel electrode PE and each of the first and second bodies Bxa and Bxb of the first and second conductive bars Bx and By, a space between the edge of the pixel electrode PE and each of the first and second conductive bars Bx and By can be reduced, thereby reducing the formation of a dark portion.

Figure 10:
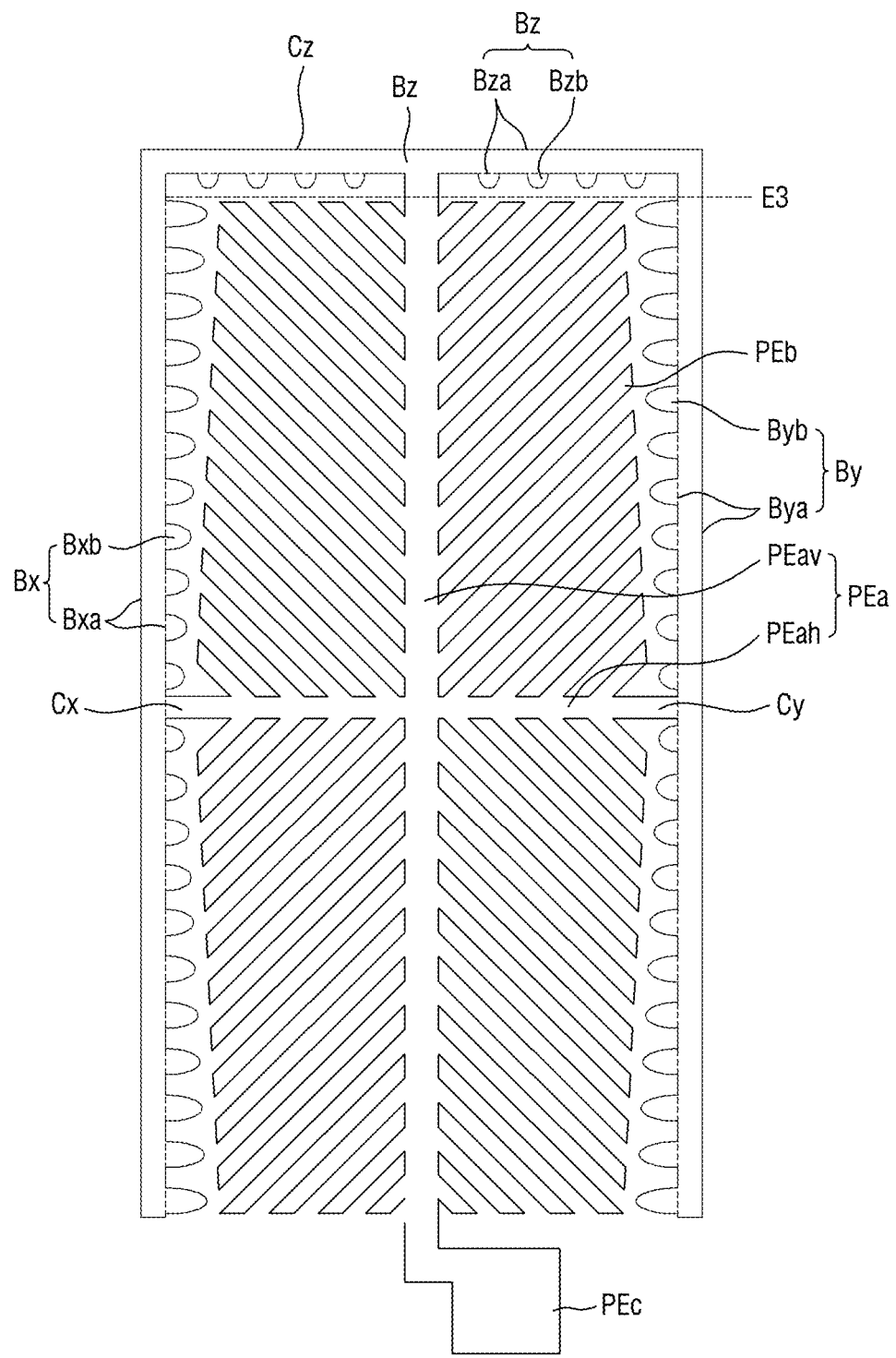
FIG. 10 illustrates yet another embodiment of the pixel electrode and the conductive bars of the display device of FIG. 1

FIG. 10 illustrates yet another embodiment of the pixel electrode PE and the conductive bars Bx and By of the display device 1 of FIG. 1. The embodiment of FIG. 10 may be substantially the same as the embodiment of FIG. 9 except that a pixel electrode PE does not include a connecting part located at a third edge E3 and that the embodiment of FIG. 10 further includes a third conductive bar Bz which faces the third edge E3 of the pixel electrode PE and a third connecting portion Cz which connects the pixel electrode PE and the third conductive bar Bz to each other.

The third conductive bar Bz may include a third body Bza which lengthwise extends along the third edge E3 and a ridge pattern Bzb provided in plurality located at a side of the third body Bza which faces the third edge E3 and protrudes toward the pixel electrode PE, as illustrated in FIG. 7.

FIGS. 11 through 20 respectively illustrate other embodiments of the pixel electrode PE and the conductive bars Bx and By of the display device 1 of FIG. 1.

Figure 11:
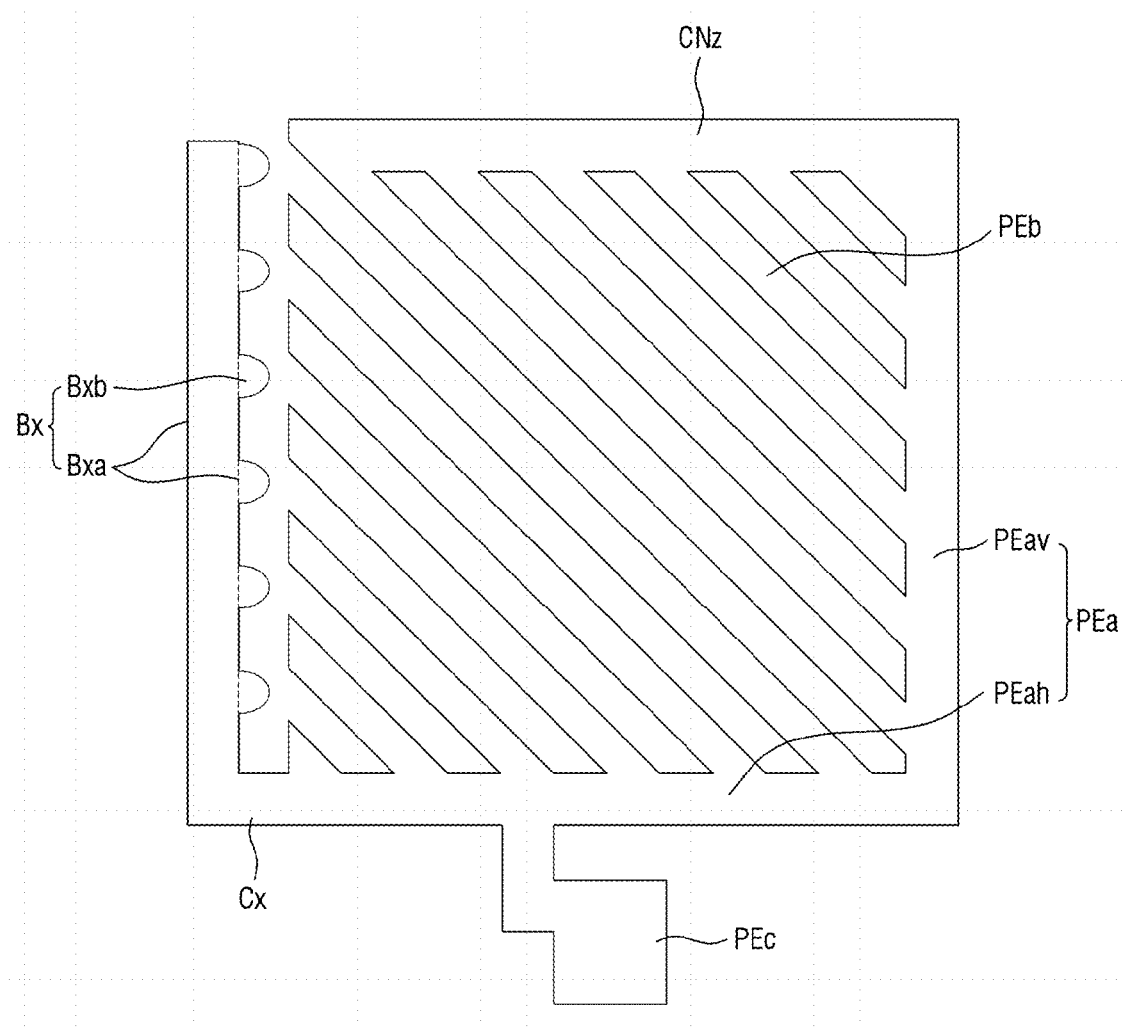
FIGS. 11 through 20 respectively illustrate other embodiments of the pixel electrode and the conductive bars of the display device of FIG. 1
Figure 12:
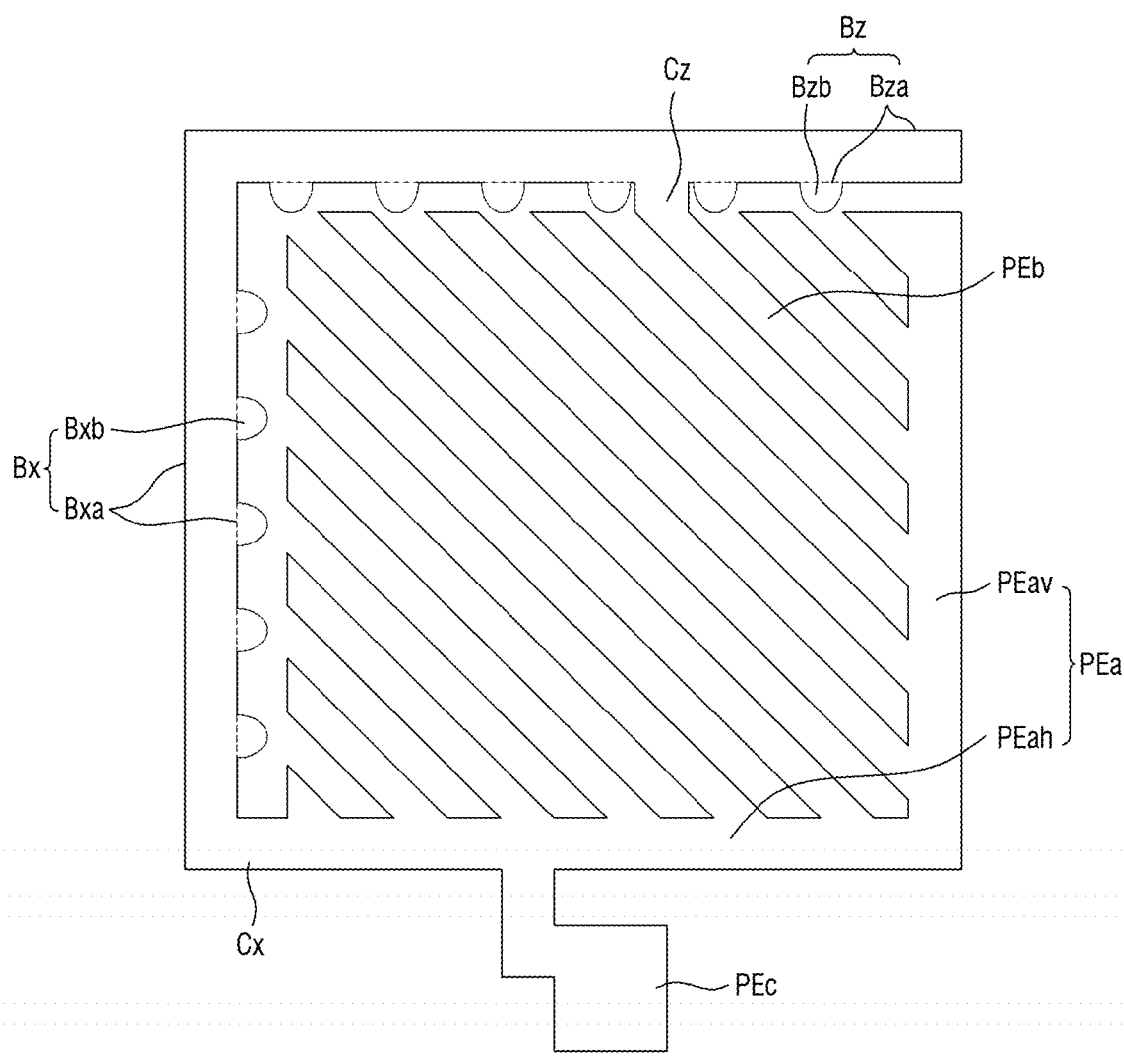

Referring to FIGS. 1, 5 and 11, the embodiment of FIG. 11 is different from the embodiment of FIG. 5 in that a pixel electrode PE includes one sub-area. In an embodiment, for example, an end of a vertical stem part PEav and an end of a horizontal stem part PEah may be connected to each other at a corner of the pixel electrode PE.

Accordingly, a stem portion PEa may have an 'L' shape, an 'L' shape rotated 90 degrees in a counterclockwise direction, an 'L' shape rotated 90 degrees in a clockwise direction, an 'L' shape rotated 180 degrees, or the like. Therefore, the pixel electrode PE may have only one sub-area. In FIG. 11, the stem portion PEa is shaped like 'L' rotated 90 degrees in the counterclockwise direction.

Branch portions PEb may lengthwise extend from the stem part PEa in an upper left direction, and a portion of respective distal ends of the branch portions PEb may not be connected to each other as described above.

A first conductive bar Bx which faces the pixel electrode PE may be located at a left edge (or a first edge) of the pixel electrode PE. The first conductive bar Bx may be connected to the pixel electrode PE by a first connecting portion Cx. A branch connecting portion Cnz which connects distal ends of some branch portions PEb may be located at an upper edge (or a third edge E3) of the pixel electrode PE.

Although not illustrated in FIG. 11, a second conductive bar which faces the pixel electrode PE and a second connecting portion which connects the second conductive bar and the pixel electrode PE may further be located at a right edge (or a second edge) of the pixel electrode PE. Referring to FIGS. 1, 5, 11 and 12, the embodiment of FIG. 12 may be substantially the same as the embodiment of FIG. 11 except that a pixel electrode PE does not include a branch connecting part located at an upper edge (or a third edge) and that the embodiment of FIG. 12 further includes a third conductive bar Bz which faces the upper edge (or the third edge) of the pixel electrode PE and a third connecting portion Cz which connects the pixel electrode PE and the third conductive bar Bz. The third conductive bar Bz may include a third body Bza and a plurality of ridge patterns Bzb as described above with reference to FIG. 7.

Figure 13:
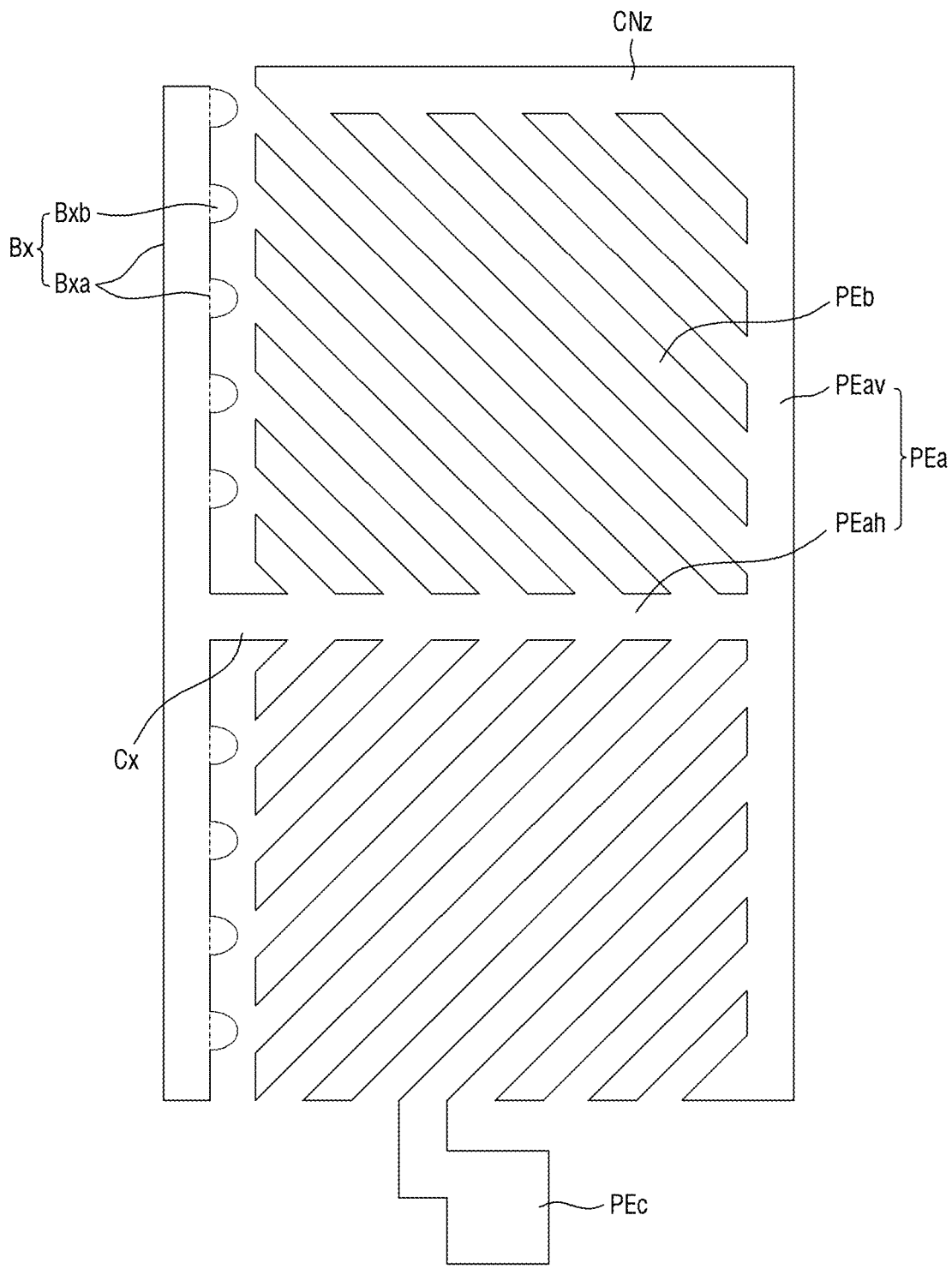

Referring to FIGS. 1, 5 and 13, the embodiment of FIG. 13 is different from the embodiment of FIG. 5 in that a pixel electrode PE is divided into two sub-areas. In an embodiment, for example, a vertical stem portion PEav may be connected to an end of a horizontal stem portion PEah, such that a stem portion PEa may have a 'T' shape rotated 90 degrees in the counterclockwise direction or a 'T' shape rotated 90 degrees in the clockwise direction. Accordingly, the pixel electrode PE may be divided into two sub-areas. In FIG. 13, the stem portion PEa is shaped like 'T' rotated 90 degrees in the clockwise direction.

Branch portions PEb may lengthwise extend from the stem portion PEa in an upper left direction and a lower left direction. Respective distal ends of some of the branch portion PEb may not be connected to each other as described above.

A first conductive bar Bx which faces the pixel electrode PE may be located at a left edge (or a first edge) of the pixel electrode PE and may be connected to the pixel electrode PE by a first connecting portion Cx. In addition, a branch connecting portion CNz which connects some distal ends of the branch parts PEb may be located at an upper edge (or a third edge E3 in FIG. 5) of the pixel electrode PE.

Although not illustrated in FIG. 13, a second conductive bar which faces the pixel electrode PE and a second connecting portion which connects the second conductive bar and the pixel electrode PE to each other may be located at a right edge (or a second edge) of the pixel electrode PE as described above.

Figure 14:
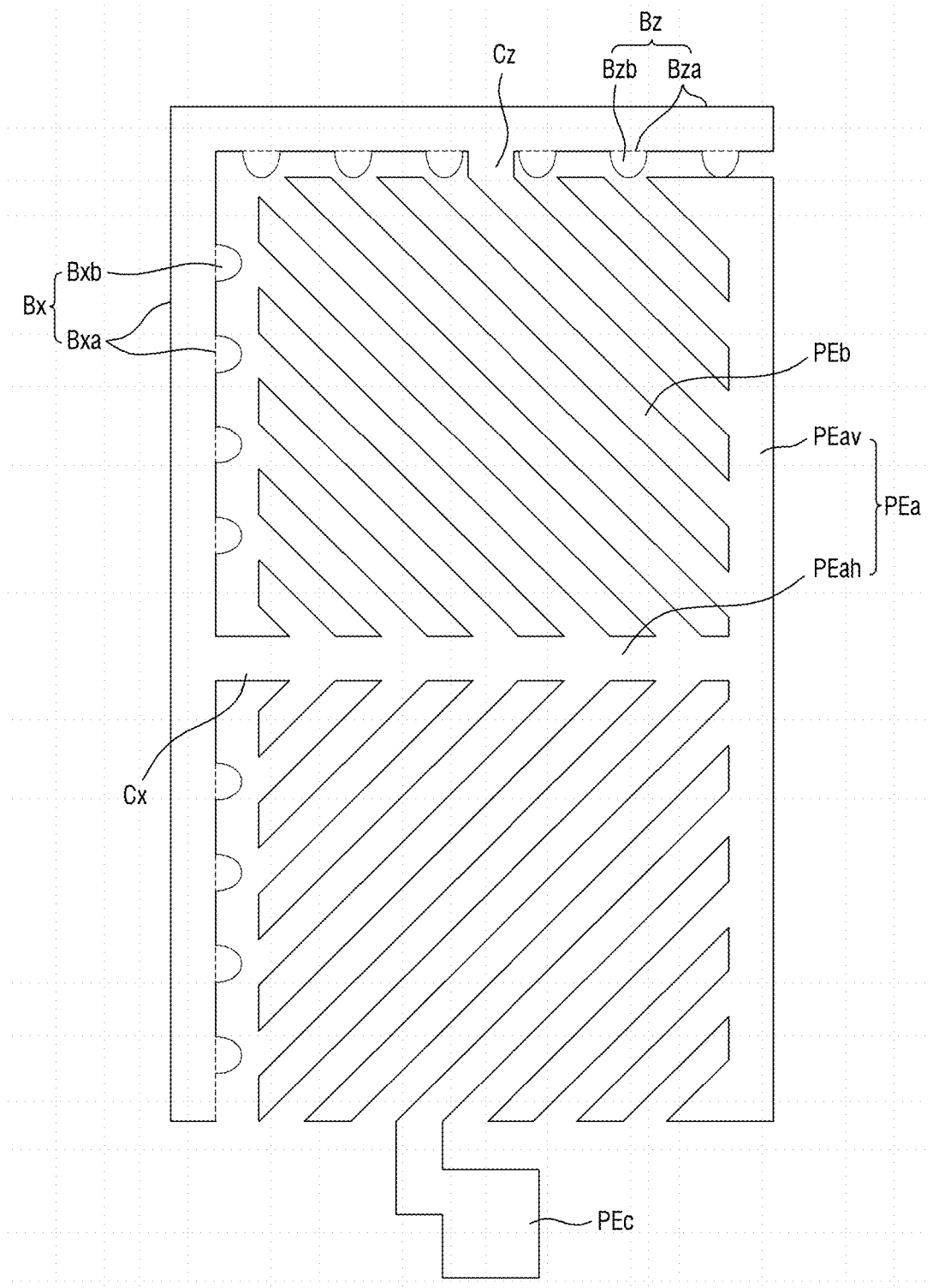

Referring to FIGS. 1, 13 and 14, the embodiment of FIG. 14 may be substantially the same as the embodiment of FIG. 13 except that a pixel electrode PE does not include a branch connecting part located at an upper edge (or a third edge) and that the embodiment of FIG. 14 further includes a third conductive bar Bz which faces the upper edge (or the third edge) of the pixel electrode PE and a third connecting portion Cz which connects the pixel electrode PE and the third conductive bar Bz to each other. The third conductive bar Bz may include a third body Bza and a plurality of ridge patterns Bzb as described above with reference to FIG. 7.

Figure 15:
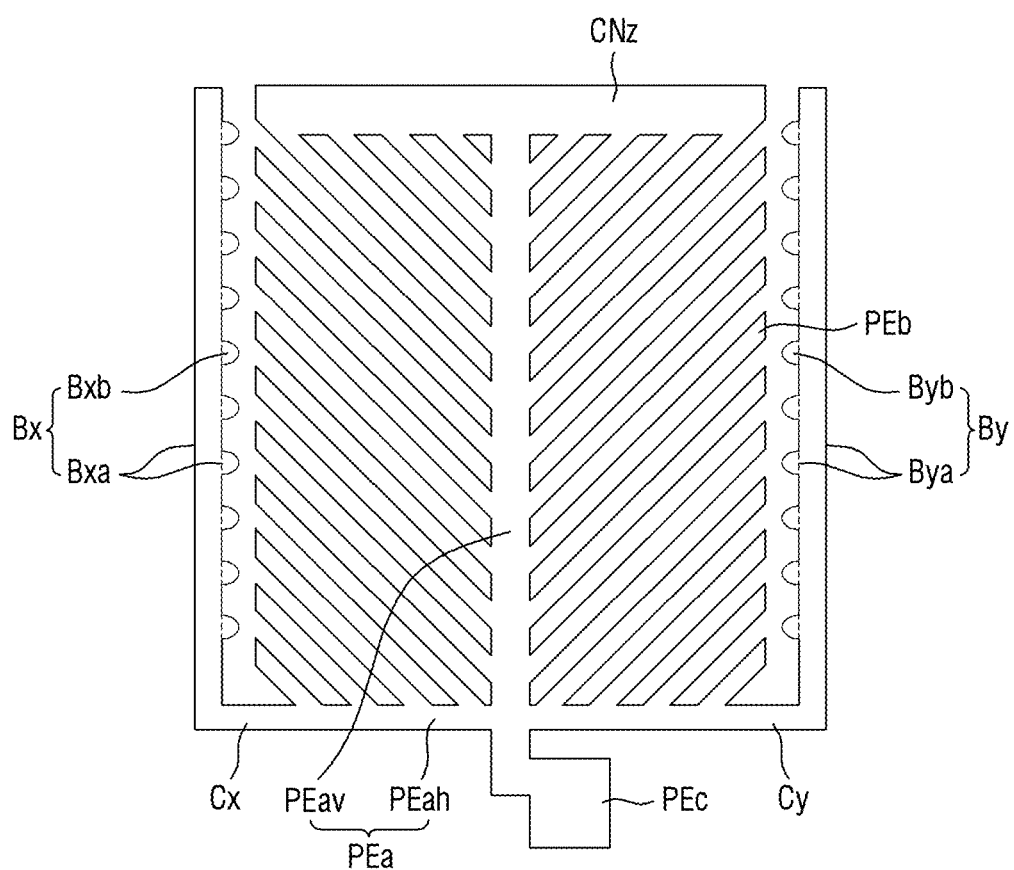

Referring to FIGS. 1, 5 and 15, the embodiment of FIG. 15 is different from the embodiment of FIG. 5 in that a pixel electrode PE is divided into two sub-areas. In an embodiment, for example, a vertical stem portion PEav may be connected to an end of a horizontal stem portion PEah, and a stem portion PEa may have a 'T' shape or a 'T' shape rotated 180 degrees. Accordingly, the pixel electrode PE may be divided into two sub-areas. In FIG. 15, the stem portion PEa is shaped like 'T' rotated 180 degrees.

Branch portions PEb may lengthwise extend from the stem portion PEa in an upper left direction and an upper right direction, and respective distal ends of the branch parts PEb may not be connected to each other as described above.

A first conductive bar Bx which faces the pixel electrode PE may be located at a left edge (or a first edge) of the pixel electrode PE and connected to the pixel electrode PE by a first connecting portion Cx. In addition, a second conductive bar By which faces the pixel electrode PE may be located at a right edge (or a second edge) of the pixel electrode PE and connected to the pixel electrode PE by a second connecting portion Cy.

A branch connecting portion CNz which connects remaining ends of the branch parts PEb may be located at an upper edge (or a third edge) of the pixel electrode PE.

Figure 16:
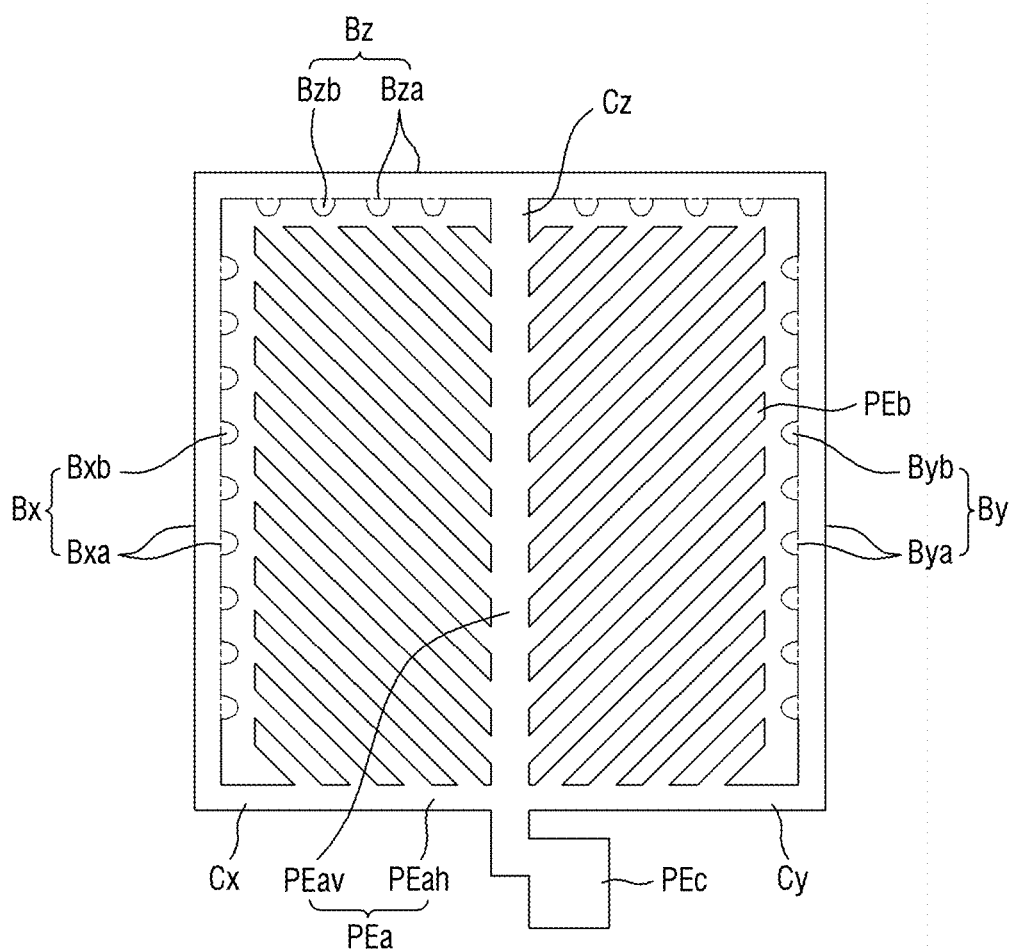

Referring to FIGS. 1, 15 and 16, the embodiment of FIG. 16 may be substantially the same as the embodiment of FIG. 15 except that a pixel electrode PE does not include a branch connecting part located at an upper edge (or a third edge) and the embodiment of FIG. 16 further includes a third conductive bar Bz which faces the upper edge (or the third edge) of the pixel electrode PE and a third connecting portion Cz which connects the pixel electrode PE and the third conductive bar Bz to each other. The third conductive bar Bz may include a third body Bza and a plurality of ridge patterns Bzb as described above with reference to FIG. 7.

Figure 17:
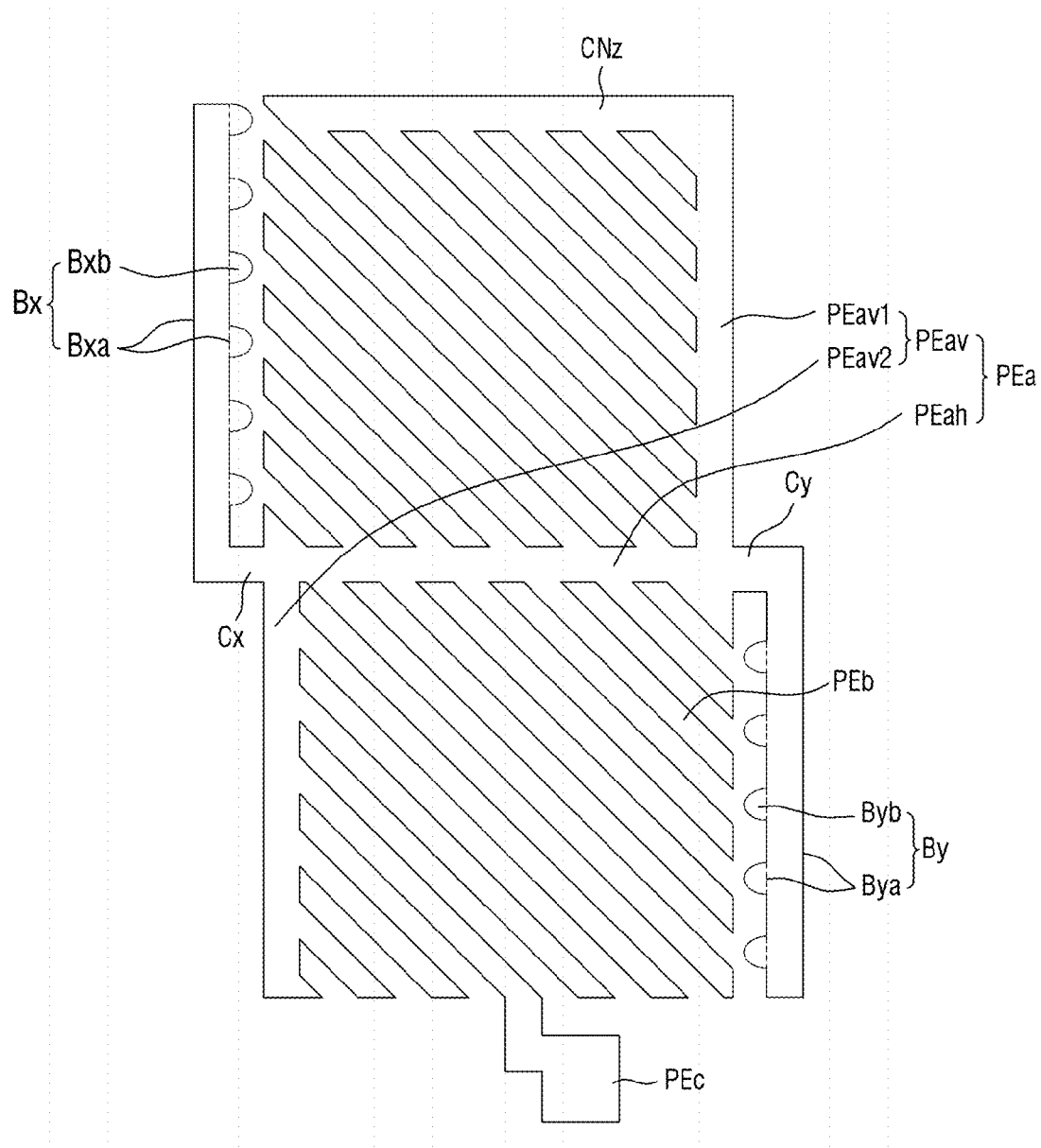

Referring to FIGS. 1, 5 and 17, the embodiment of FIG. 17 is different from the embodiment of FIG. 5 in that a pixel electrode PE is divided into two sub-areas. In an embodiment, for example, a vertical stem portion PEav may include a first vertical stem portion PEav1 and a second vertical stem portion PEav2. The first vertical stem portion PEav1 may be connected to a first end of a horizontal stem portion PEah and extend upward. In addition, the second vertical stem portion PEav2 may be connected to a second end of the horizontal stem portion PEah opposing the first end and extend downward. Accordingly, a stem portion PEa may divide the pixel electrode PE into two sub-areas.

Branch portions PEb may lengthwise extend from the stem part PEa in an upper left direction and a lower right direction. Respective distal ends of the branch portions PEb may not be connected to each other as described above.

A first conductive bar Bx which faces the pixel electrode PE may be located at a left edge (or a first edge) of the pixel electrode PE and connected to the pixel electrode PE by a first connecting portion Cx. In addition, a second conductive bar By which faces the pixel electrode PE may be located at a right edge (or a second edge) of the pixel electrode PE and connected to the pixel electrode PE by a second connecting portion Cy. In some embodiments, the first conductive bar Bx and the second conductive bar By may face the branch portions PEb but may not face the vertical stem part PEav.

A branch connecting portion CNz which connects remaining ends of the branch portions PEb to each other may be located at an upper edge (or a third edge) of the pixel electrode PE.

Figure 18:
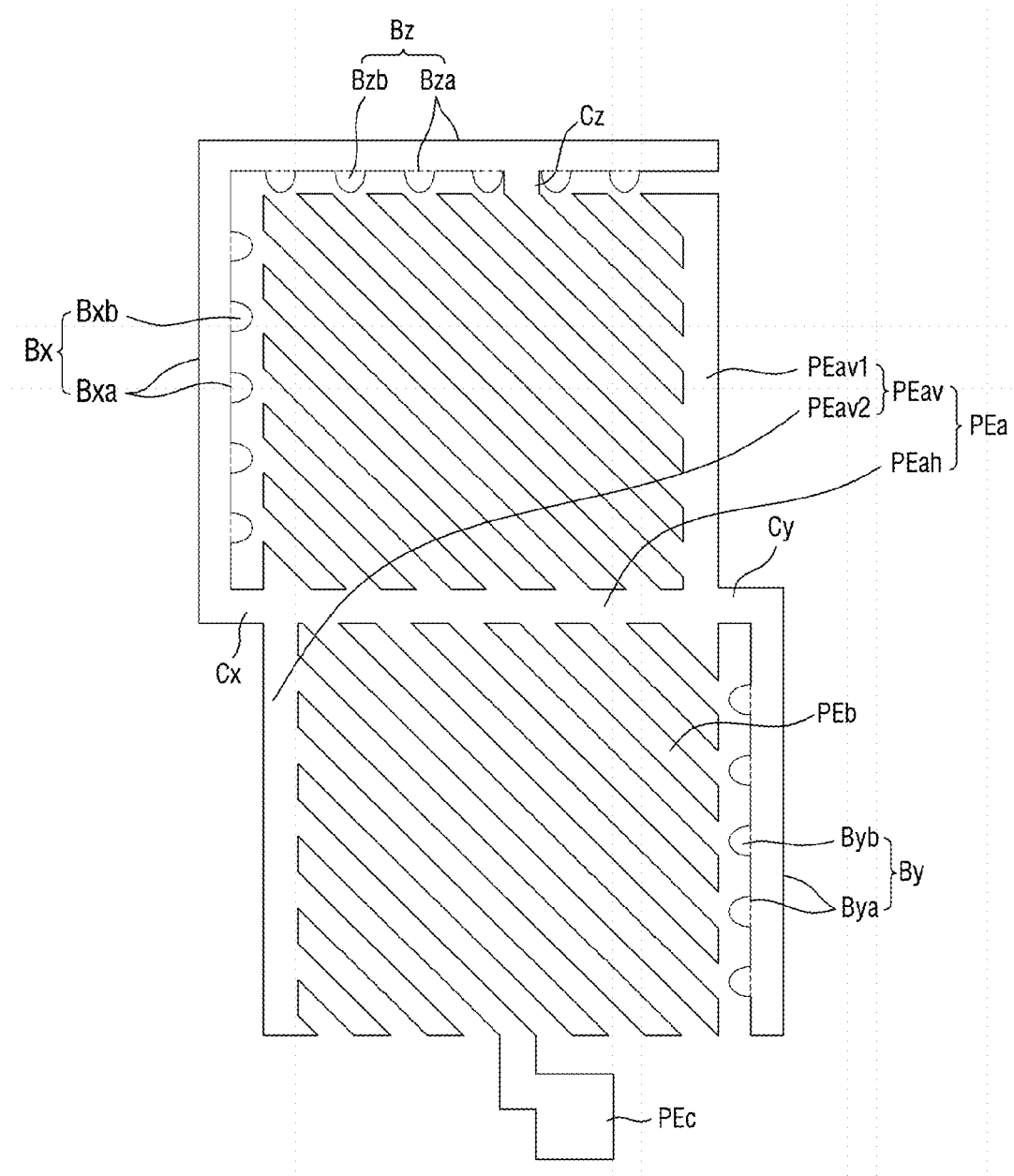

Referring to FIGS. 1, 17 and 18, the embodiment of FIG. 18 may be substantially the same as the embodiment of FIG. 17 except that a pixel electrode PE does not include a branch connecting part located at an upper edge and the embodiment of FIG. 18 further includes a third conductive bar Bz which faces the upper edge of the pixel electrode PE and a third connecting portion Cz which connects the pixel electrode PE and the third conductive bar Bz to each other.

Figure 19:
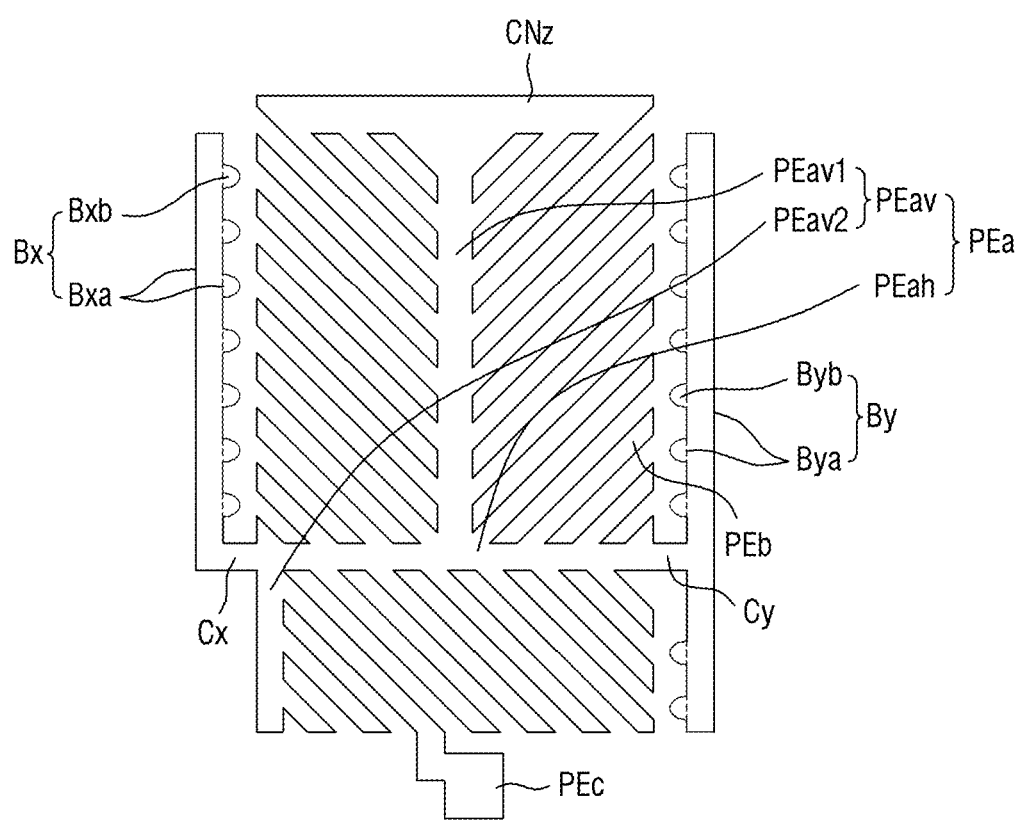

Referring to FIGS. 1, 5 and 19, the embodiment of FIG. 19 is different from the embodiment of FIG. 5 in that a pixel electrode PE is divided into three sub-areas. In an embodiment, for example, a vertical stem portion PEav may include a first vertical stem portion PEav1 and a second vertical stem portion PEav2. The first vertical stem portion PEav1 may be connected to a horizontal stem portion PEah to form a 'T' shape or a 'T' shape rotated 180 degrees. In addition, the second vertical stem portion PEav2 may be connected to an end of the horizontal stem part PEah and extend in an opposite direction to a direction in which the first vertical stem portion PEav1 extends from the horizontal stem portion PEah. Accordingly, a stem part PEa may divide the pixel electrode PE into three sub-areas.

Branch portions PEb may lengthwise extend from the stem portion PEa in an upper left direction, an upper right direction and a lower right direction. Respective distal ends of the branch parts PEb may not be connected to each other as described above.

A first conductive bar Bx which faces the pixel electrode PE may be located at a left edge (or a first edge) of the pixel electrode PE and connected to the pixel electrode PE by a first connecting portion Cx. In addition, a second conductive bar By which faces the pixel electrode PE may be located at a right edge (or a second edge) of the pixel electrode PE and connected to the pixel electrode PE by a second connecting portion Cy. In some embodiments, the first conductive bar Bx and the second conductive bar By may face the branch portions PEb but may not face the vertical stem part PEav.

A branch connecting portion CNz which connects the distal ends of the branch portions PEb may be located at an upper edge (or a third edge) of the pixel electrode PE.

Figure 20:
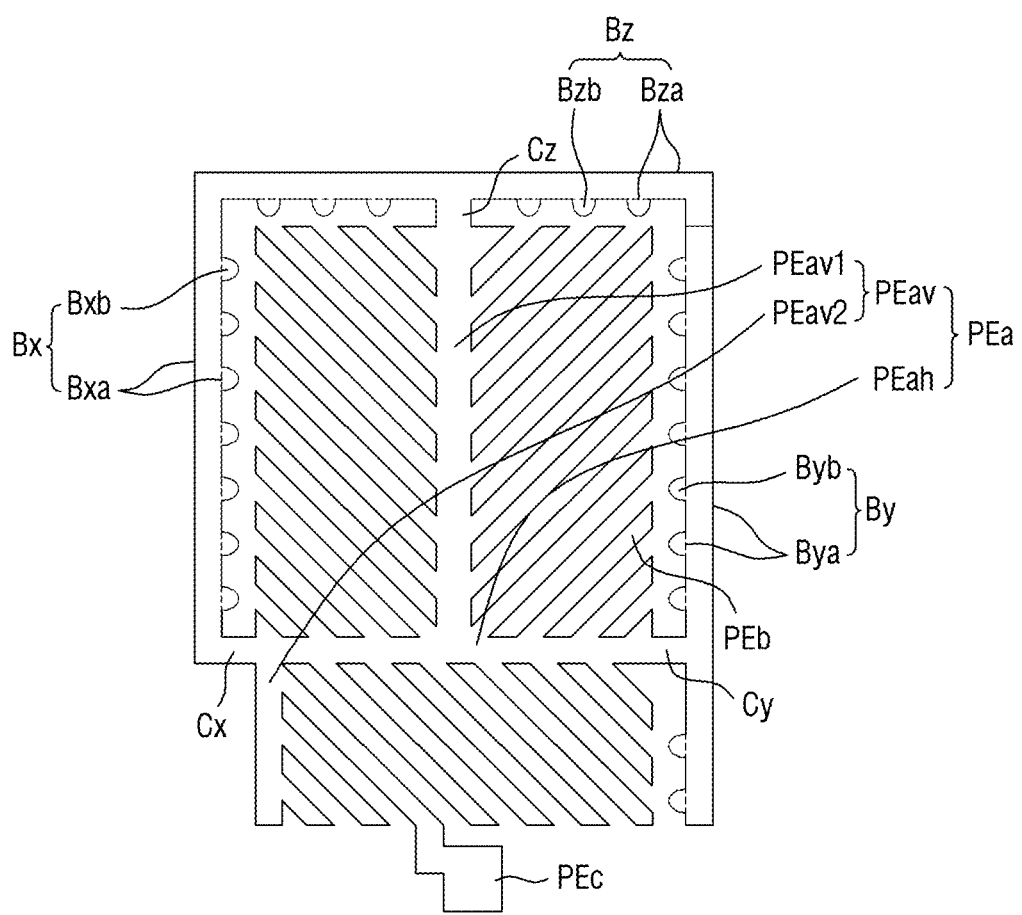

Referring to FIGS. 1, 19 and 20, the embodiment of FIG. 20 may be substantially the same as the embodiment of FIG. 19 except that a pixel electrode PE does not include a branch connecting part located at an upper edge (or a third edge) and the embodiment of FIG. 20 further includes a third conductive bar Bz which faces the upper edge of the pixel electrode PE and a third connecting portion Cz which connects the pixel electrode PE and the third conductive bar Bz.

Figure 21:
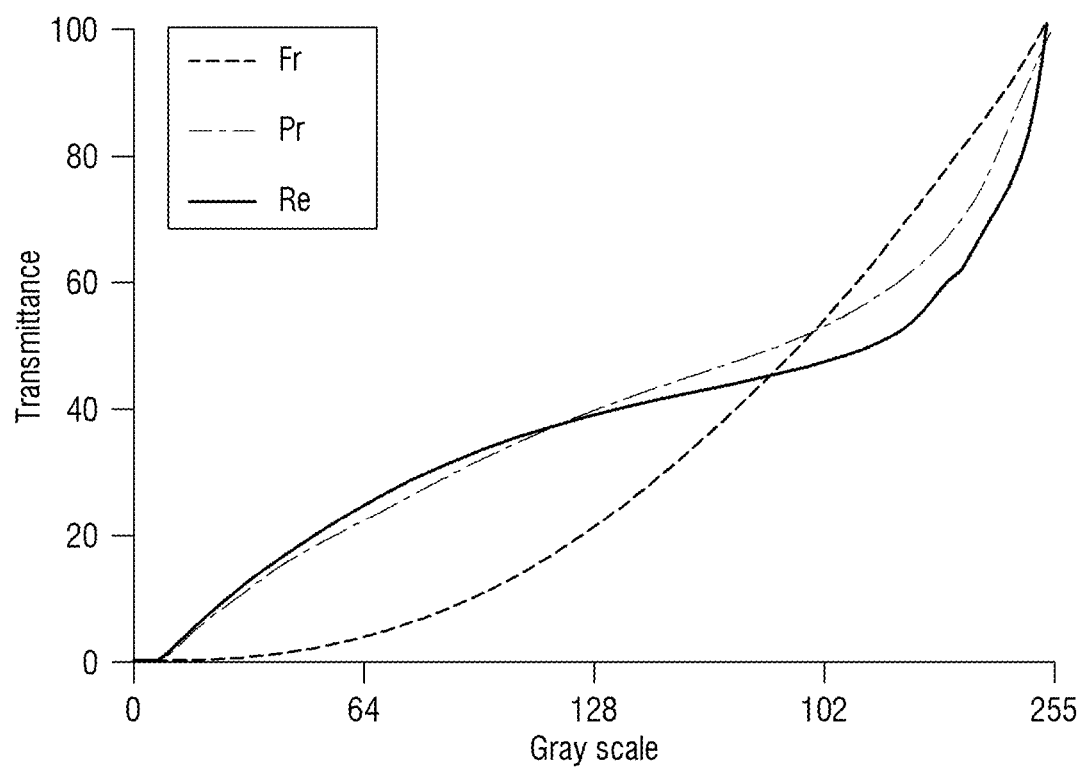
FIG. 21 is a graph illustrating a lateral gamma curve of an embodiment of a display device according to the invention and a display device according to a comparative example.

FIG. 21 is a graph illustrating a lateral gamma curve of an embodiment of a display device according to the invention, more specifically, a graph illustrating the lateral gamma curve of the display device 1 of FIG. 1, and of a display device according to a comparative example. In FIG. 21, Fr represents a front gamma curve, Re represents a lateral gamma curve of a display device without conductive bars according to a comparative example, and Pr represents a lateral gamma curve of an embodiment of a display device including conductive bars according to the invention.

Referring to FIG. 21, the lateral gamma curve Pr of the display device including conductive bars according to the invention is relatively closer to the front gamma curve Fr than the lateral gamma curve Re of the display device without the conductive bars according to the comparative example. Therefore, the embodiment of the display device according to the invention has improved lateral visibility. In addition, since the embodiment of the display device according to the invention includes the conductive bars, the lateral gamma curve Pr is relatively gentler (e.g., more gradually changed over the gray scale) than the lateral gamma curve Re of display device according to the comparative example. Accordingly, a rapid change in color at the side of the embodiment of the display device according to the invention can be reduced or effectively prevented, which results in reduced color distortion.

Figure 22:
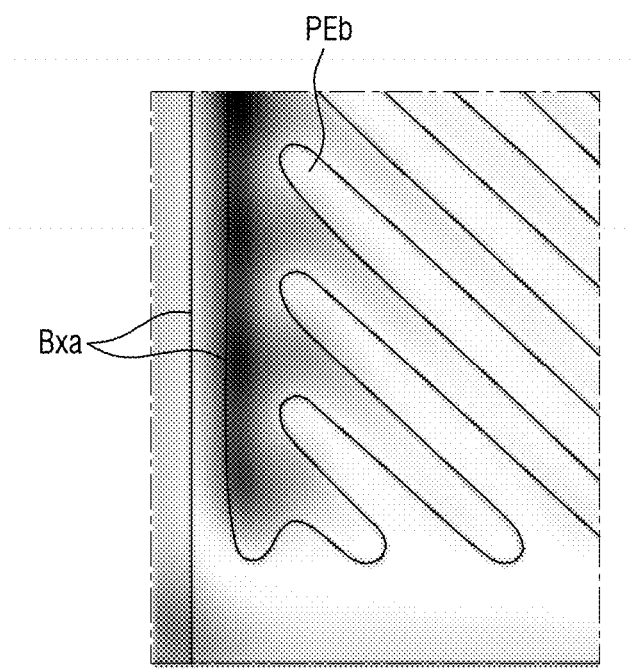
FIG. 22 illustrates an image of a portion of a pixel for which ridge patterns of a conductive bar are omitted from a display device according to a comparative example.
Figure 23:
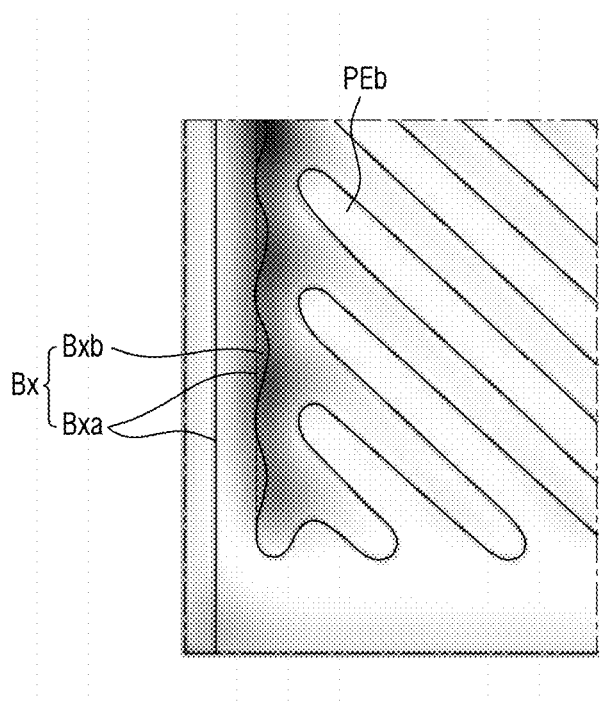
FIG. 23 illustrates an image of a portion of a pixel in an embodiment of a display device including ridge patterns of a conductive bar according to the invention.

FIG. 22 illustrates an image of a portion of a pixel for which ridge patterns of a conductive bar are omitted from a display device according to a comparative example. FIG. 23 illustrates an image of a portion of a pixel in a display device including ridge patterns of a conductive bar according to the invention. In FIGS. 22 and 23, an area around a first conductive bar is illustrated as a portion of a pixel.

Referring to FIG. 22, if ridge patterns are omitted, a dark portion is formed in a space between a pixel electrode PE with the branch portion PEb and a first body Bxa of a first conductive bar Bx. On the other hand, referring to FIG. 23, if a first conductive bar Bx includes a plurality of ridge patterns Bxb as well as a first body Bxa, a dark portion formed in a space between a pixel electrode PE and the first body Bxa is reduced as compared with FIG. 22. That is, in the embodiment of the display device according to the invention, the formation of a dark portion in the space between the pixel electrode PE and a conductive bar can be reduced, thereby increasing transmittance at the pixel.

Figure 24:
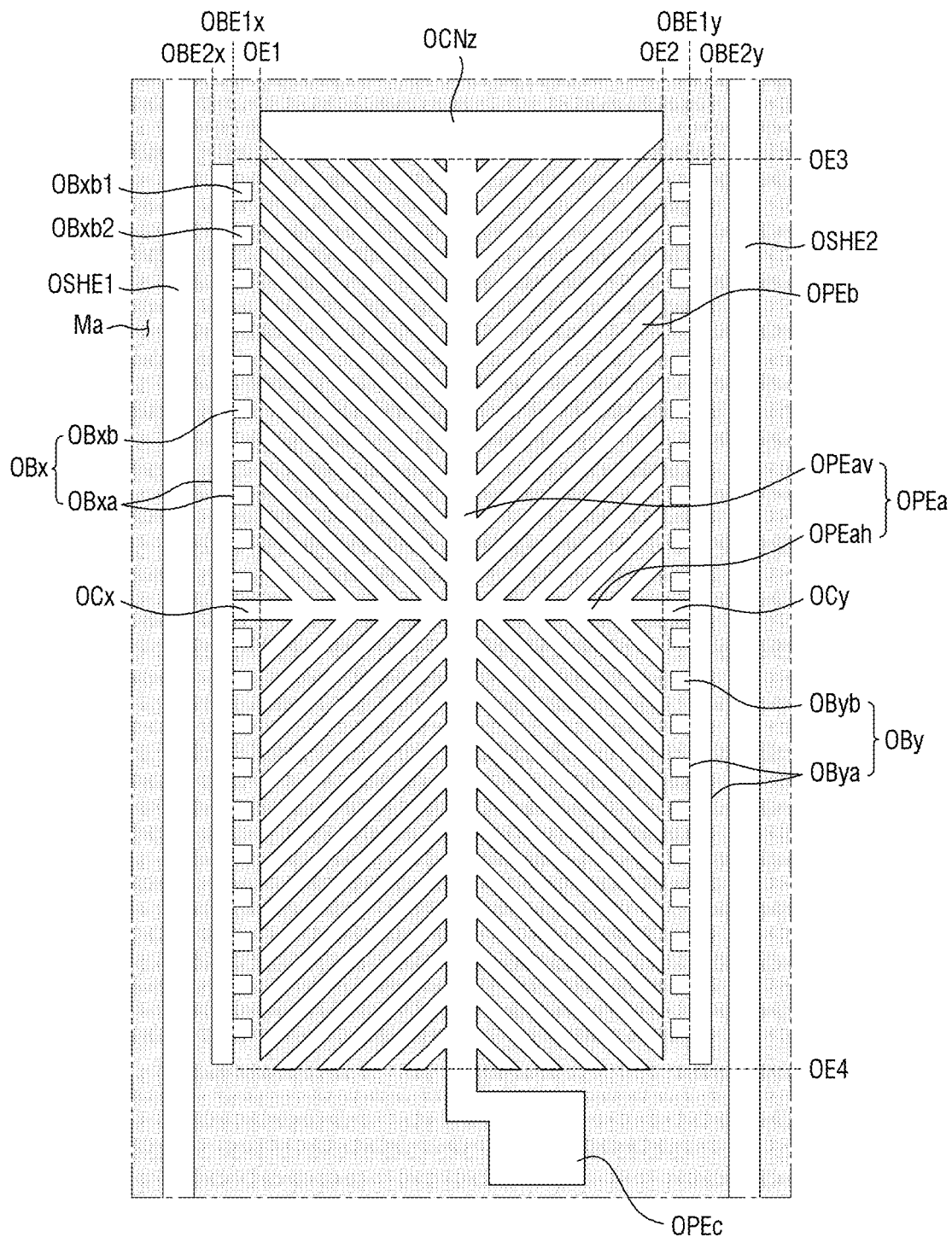
FIG. 24 is a top plan view of an embodiment of a mask for manufacturing a display device according to the invention.

FIG. 24 is a top plan view of a mask for manufacturing a display device according to the invention, more specifically, a top plan view of a mask for manufacturing the pixel electrode PE and the first and second conductive bars Bx and By of FIG. 5 together with the first shielding electrode SHE1 and the second shielding electrode SHE2 of FIG. 1. A embodiment of a mask for manufacturing a display device according to the invention and an embodiment of a method of manufacturing a first display substrate of a display device according to the invention will now be briefly described with reference to FIG. 24 together with FIGS. 1 through 6.

First, a gate electrode GE, a gate line GLn and a storage electrode line SLn are formed on a first base substrate SUB1, and a gate insulating layer GI is stacked on the gate electrode GE, the gate line GLn and the storage electrode line SLn. The gate electrode GE, the gate line GLn and the storage electrode line SLn may be formed from a same material layer on the first base substrate SUB1 to be disposed in a same layer of the first display substrate 100.

A semiconductor layer SM, a plurality of ohmic contact members Oha through Ohc, a source electrode SE, a drain electrode DE and data lines DLm and DLm+1 are formed on the gate insulating layer GI. A first passivation layer PA1, an organic layer ILA and a second passivation layer PA2 are sequentially formed, and a contact hole CT is formed in the first passivation layer PA1, the organic layer ILA and the second passivation layer PA2.

A transparent conductive material layer such as ITO or IZO is stacked on the second passivation layer PA2, and a photosensitive material layer is coated on the transparent conductive material layer. Then, the photosensitive material layer is exposed to light through a mask for manufacturing an embodiment of a display device according to the invention, thereby forming photosensitive layer patterns.

If the photosensitive material layer has positive photosensitivity that causes portions exposed to light to be removed, a pixel electrode pattern OPEa, OPEb, OPEc and OCNz corresponding to a pixel electrode PE, a first conductive bar pattern OBx corresponding to a first conductive bar Bx, a second conductive bar pattern OBy corresponding to a second conductive bar By, a first connecting portion pattern OCx corresponding to a first connecting portion Cx, and a second connecting portion pattern OCy corresponding to a second connecting portion Cy may be opaque. In addition, a first shielding electrode pattern OSHE1 corresponding to a first shielding electrode SHE1 and a second shielding electrode pattern OSHE2 corresponding to a second shielding electrode SHE2 may be opaque, and the other portion Ma (e.g., shaded portions in FIG. 24) may be transparent.

Alternatively, if the photosensitive layer has negative photosensitivity that causes portions not exposed to light to be removed, the pixel electrode pattern OPEa, OPEb, OPEc and OCNz, the first conductive bar pattern OBx, the second conductive bar pattern OBy, the first connecting portion pattern OCx, the second connecting portion pattern OCy, the first shielding electrode pattern OSHE1 and the second shielding electrode pattern OSHE2 may be transparent, and the other portion MA may be opaque.

The pixel electrode pattern OPEa, OPEb, OPEc and OCNz may include a stem portion pattern OPEa corresponding to a stem portion PEa of the pixel electrode PE, branch portion patterns OPEb corresponding to branch portions PEb of the pixel electrode PE, a protruding portion pattern OPEc corresponding to a protruding portion PEc of the pixel electrode PE, and a branch connecting portion pattern OCNz corresponding to a branch connecting portion CNz of the pixel electrode PE. The stem portion pattern OPEa may include a horizontal stem portion pattern OPEah corresponding to a horizontal stem portion PEah of the pixel electrode PE and a vertical stem portion pattern OPEav corresponding to a vertical stem portion PEav of the pixel electrode PE. Ends of neighboring branch portion patterns OPEb may be separated from each other. In particular, distal ends of the branch portion patterns OPEb which face the first conductive bar pattern OBx and the second conductive bar pattern OBy may be separated from each other. That is, the St defined between the separated branch portion patterns OPEb may have an open end at the distal ends of the branch portion patterns OPEb.

The first conductive bar pattern OBx may include a first body pattern OBxa corresponding to a first body Bxa of the first conductive bar Bx and a plurality of first patch patterns OBxb respectively corresponding to a plurality of ridge patterns Bxb of the first conductive bar Bx. Like the ridge patterns Bxb, the first patch patterns OBxb may protrude from the first body pattern OBxa toward a first edge OE1 of the pixel electrode pattern OPEa, OPEb, OPEc and OCNz. In the mask, an edge of first body pattern OBxa which faces the first edge OE1 will be referred to as a first inner edge pattern OBE1$x$, and an edge of the first body pattern OBxa which is located opposite the first inner edge pattern OBE1$x$ will be referred to as a first outer edge pattern OBE2$x$.

In the mask, among the plurality of first patch patterns OBxb, patch patterns OBxb1 and OBxb2 correspond to a first ridge pattern Bxb1 and a second ridge pattern Bxb2, respectively.

Similarly, the second conductive bar pattern OBy may include a second body pattern OBya corresponding to a second body Bya of the second conductive bar By and a plurality of second patch patterns OByb corresponding to a plurality of ridge patterns Byb of the second conductive bar By. Like the ridge patterns Byb, the second patch patterns OByb may protrude from the second body pattern OBya toward a second edge OE2 of the pixel electrode pattern OPEa, OPEb, OPEc and OCNz. Third and fourth edges OE3 and OE4 indicated for the mask correspond to third and fourth edges E3 and E4 discussed above. In the mask, an edge of second body pattern OBya which faces the second edge OE2 will be referred to as a second inner edge pattern OBE1$y$, and an edge of the second body pattern OBya which is located opposite the second inner edge pattern OBE1$y$ will be referred to as a second outer edge pattern OBE2$y$.

Figure 25:
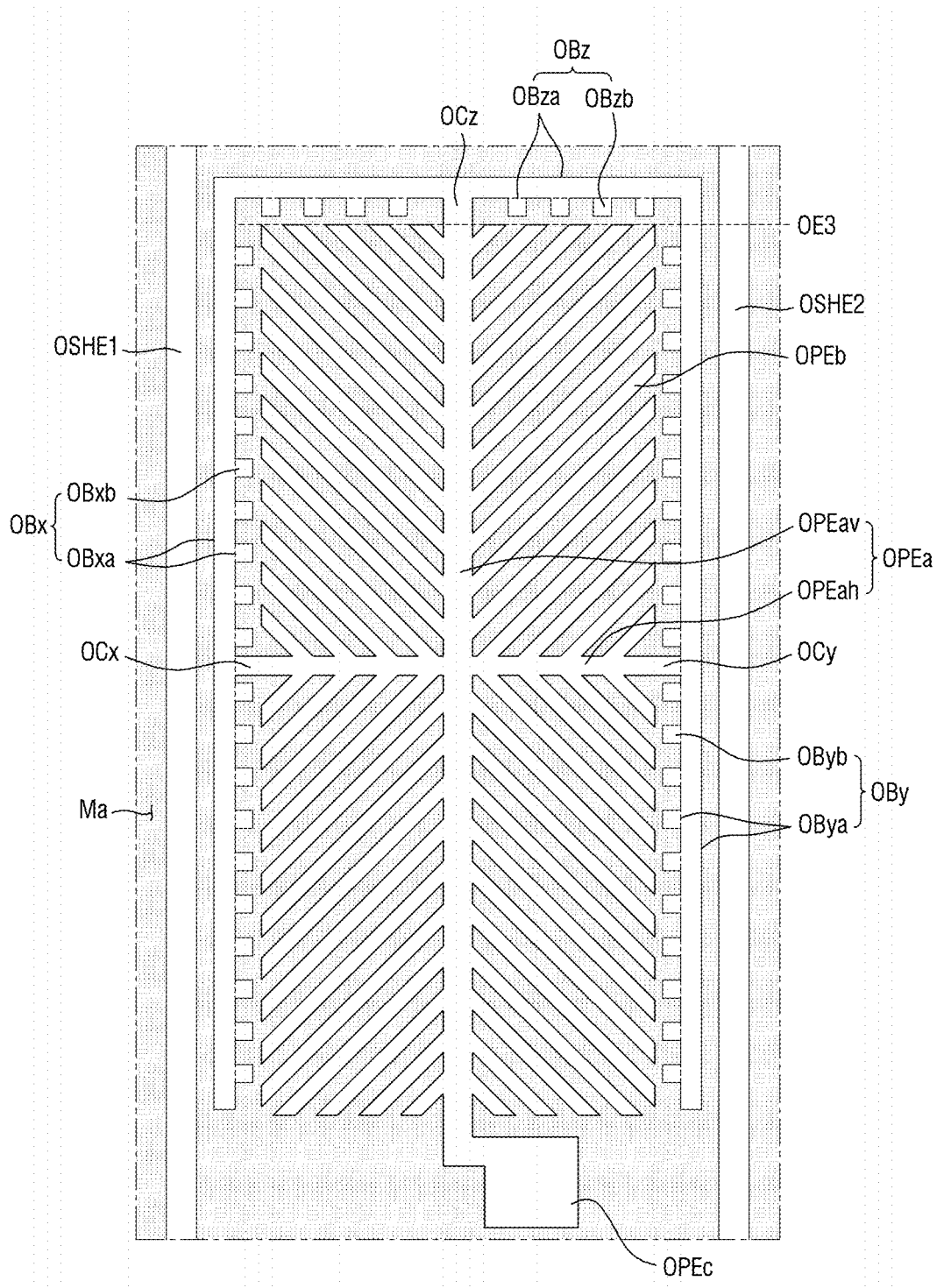
FIG. 25 is a top plan view of another embodiment of a mask for manufacturing a display device according to the invention.

FIG. 25 is a top plan view of another embodiment of a mask for manufacturing a display device according to the invention, more specifically, a top plan view of a mask for manufacturing the pixel electrode PE and the first, second and third conductive bars Bx, By and Bz of FIG. 7 together with the first shielding electrode SHE1 and the second shielding electrode SHE2 of FIG. 1.

Referring to FIGS. 1, 7 and 25, the mask of FIG. 25 may be substantially the same as the mask of FIG. 25 except that it does not include a branch connecting portion pattern OCNz (see FIG. 24) corresponding to a branch connecting portion CNz of a pixel electrode PE and further includes a third conductive bar pattern OBz corresponding to a third conductive bar Bz and a third connecting portion pattern OCz corresponding to a third connecting portion Cz. The third conductive bar pattern OBz may include a third body pattern OBza corresponding to a third body Bza of the third conductive bar Bz and a plurality of third patch patterns OBzb corresponding to a plurality of ridge patterns Bzb of the third conductive bar Bz.

Figure 26:
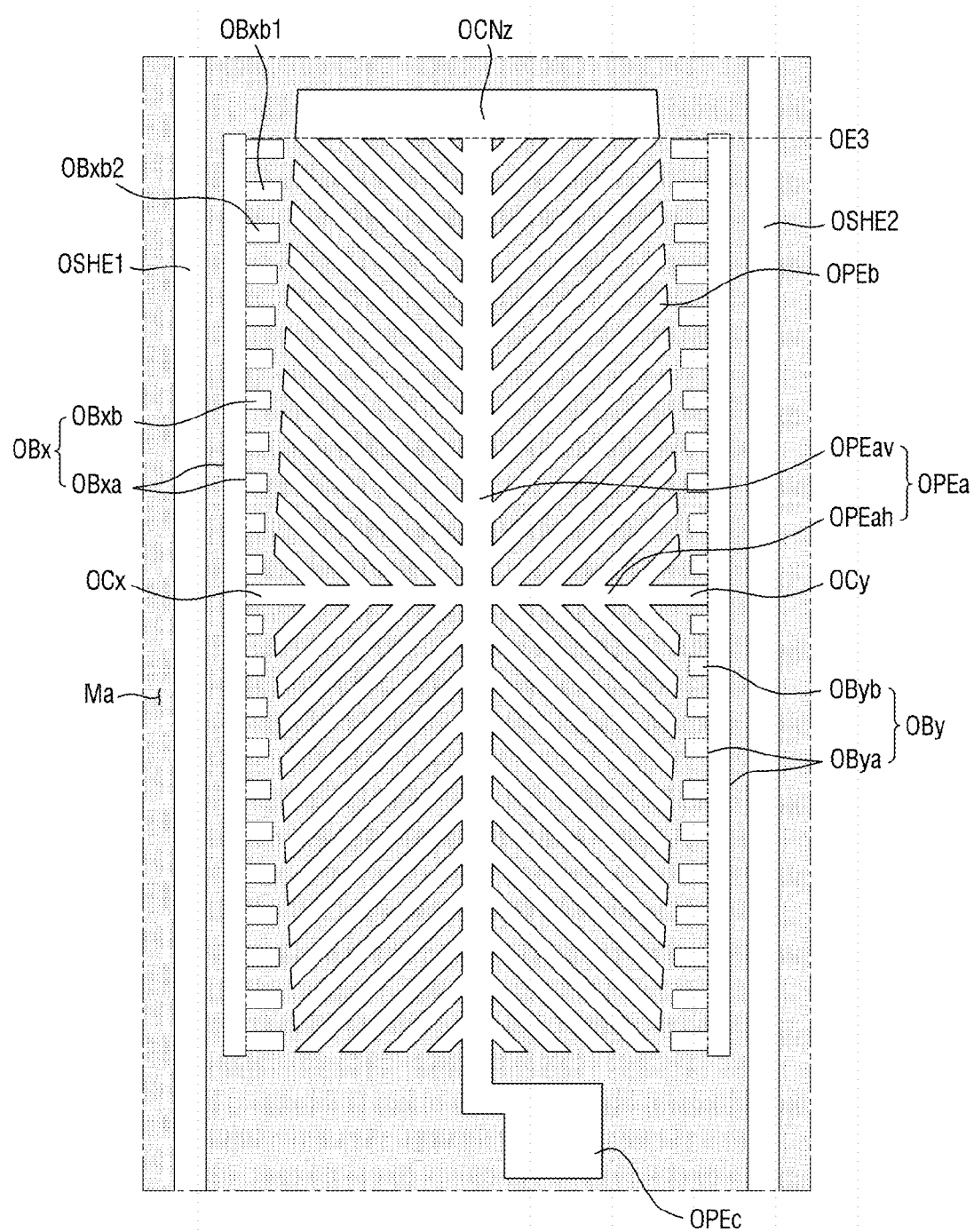
FIG. 26 is a top plan view of still another embodiment of a mask for manufacturing a display device according to the invention.

FIG. 26 is a top plan view of still another embodiment of a mask for manufacturing a display device according to the invention, more specifically, a top plan view of a mask for manufacturing the pixel electrode PE and the first and second conductive bars Bx and By of FIG. 8 together with the first shielding electrode SHE1 and the second shielding electrode SHE2 of FIG. 1.

Referring to FIGS. 1, 8 and 26, the mask of FIG. 26 may be substantially the same as the mask of FIG. 24 except that a distance between each of a first body pattern OBxa and a second body pattern OBya, and a pixel electrode pattern OPEa, OPEb, OPEc and OCNz, varies along a lengthwise direction of the first body pattern Obxa and a lengthwise direction of the second body pattern Obya, respectively. An increase in the distance between each of the first body pattern OBxa and the second body pattern Obya, and the pixel electrode pattern OPEa, OPEb, OPEc and OCNz, increases protruding lengths of patch patterns OBxb or Obyb, respectively.

Figure 27:
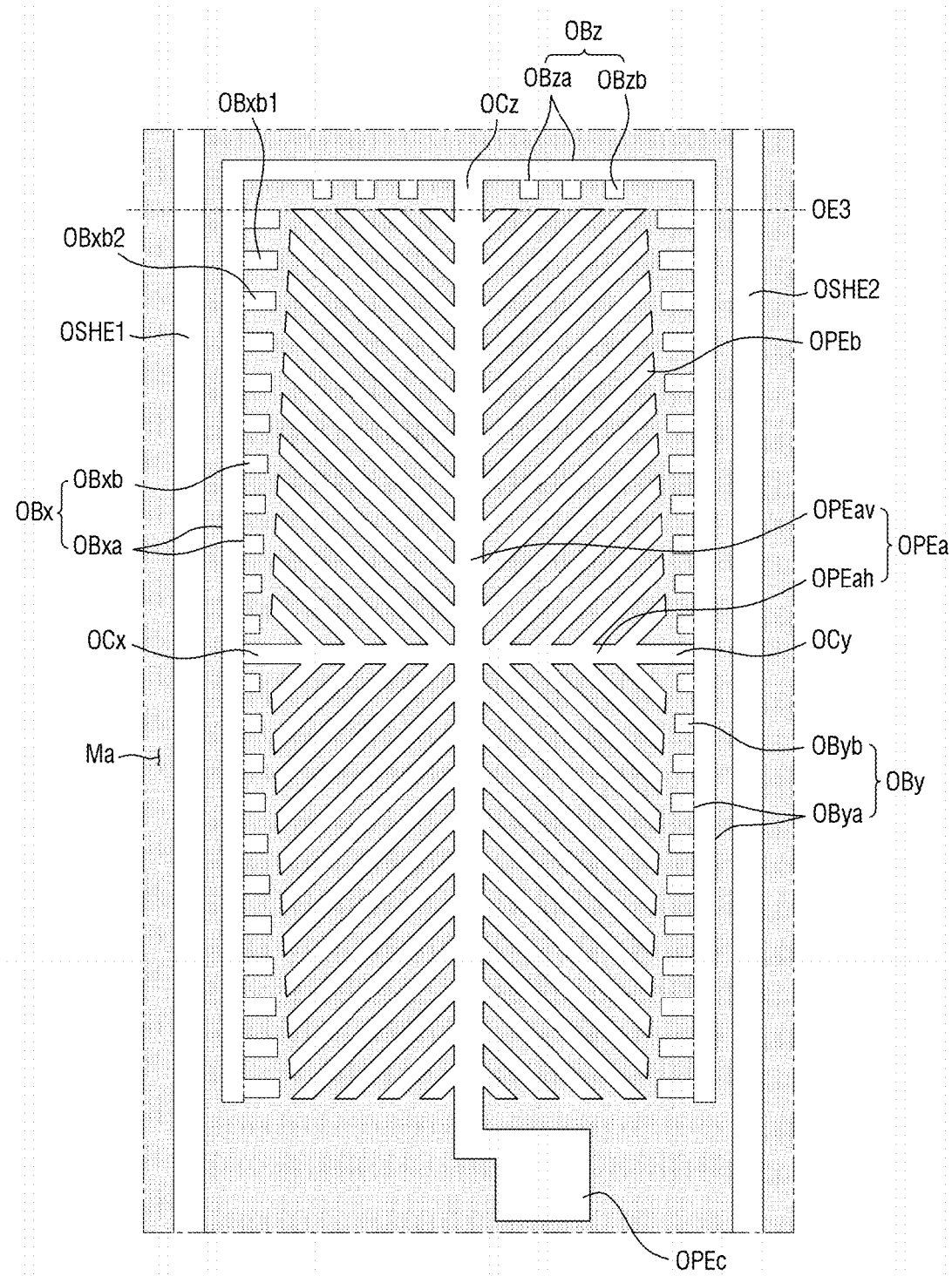
FIG. 27 is a top plan view of yet another embodiment of a mask for manufacturing a display device according to the invention.

FIG. 27 is a top plan view of yet another embodiment of a mask for manufacturing a display device according to the invention, more specifically, a top plan view of a mask for manufacturing the pixel electrode PE and the first, second and third conductive bars Bx, By and Bz of FIG. 10 together with the first shielding electrode SHE1 and the second shielding electrode SHE2 of FIG. 1.

Referring to FIGS. 1, 10 and 27, the mask of FIG. 27 may be substantially the same as the mask of FIG. 26 except that it does not include a branch connecting pattern OCNz (see FIG. 26) corresponding to a branch connecting portion CNz of a pixel electrode PE and further includes a third conductive bar pattern OBz corresponding to a third conductive bar Bz and a third connecting portion pattern OCz corresponding to a third connecting portion Cz. The third conductive bar pattern OBz may include a third body pattern OBza corresponding to a third body Bza of the third conductive bar Bz and a plurality of third patch patterns OBzb corresponding to a plurality of ridge patterns Bzb of the third conductive bar Bz.

Although not illustrated in the drawings, the embodiments of the structures of the pixel electrode and the conductive bars of FIGS. 11 through 20 and the shielding electrodes of FIG. 1 can be formed by changing the structure of a mask for manufacturing a display device.

By manufacturing a display device using any of the above-described embodiments of the masks for manufacturing a display device according to the invention, shielding electrodes, a pixel electrode and conductive bars can be manufactured using one single mask. Therefore, the process of manufacturing a display device can be simplified, and a display device with improved transmittance can be provided.

According to one or more embodiment of the invention, a display device having improved transmittance can be provided.

In addition, according to one or more embodiment of the invention, a display device having improved lateral visibility can be provided.

Furthermore, according to one or more embodiment of the invention, a mask for manufacturing a display device having improved transmittance and lateral visibility can be provided.

However, the effects of the invention are not restricted to the one set forth herein. The above and other effects of the invention will become more apparent to one of daily skill in the art to which the invention pertains by referencing the claims.

Although embodiments of the invention have been disclosed for illustrative purposes, the embodiments are only exemplified, hut do not limit the invention. Those skilled in the art will appreciate that various modifications and applications are possible, without departing from the scope and spirit of the invention as disclosed in the accompanying claims. For example, each element specified in embodiments of the invention can be variously modified and implemented. Further, differences related to such modifications and applications should be interpreted as being included in the scope of the invention defined by the accompanying claims.

What is claimed is:

1. A display device comprising:
   a base substrate;
   a pixel electrode on the base substrate;
   a first conductive bar which is adjacent to and separated from a first edge of the pixel electrode in a top plan view, the first conductive bar disposed in a same layer as the pixel electrode; and
   a common electrode which overlaps the pixel electrode,
   wherein in the top plan view, the first conductive bar comprises:
      a first body which lengthwise extends along the first edge of the pixel electrode and includes an edge which faces the first edge of the pixel electrode, and
      a plurality of ridge patterns each protruding from the edge of the first body which faces the first edge of the pixel electrode and toward the pixel electrode.

2. The display device of claim 1, further comprising a first connecting portion which connects the first conductive bar and the pixel electrode to each other and is in the same layer as the pixel electrode.

3. The display device of claim 1, wherein the pixel electrode comprises a stem portion and a plurality of branch portions which extend outwards from the stem portion to define distal ends of the branch portions.

4. The display device of claim 3, wherein
   the first edge of the pixel electrode is common to distal ends of branch portions which face the first conductive bar, and
   the distal ends of the branch portions which face the first conductive bar are separated from each other at the first edge of the pixel electrode.

5. The display device of claim 4, wherein the pixel electrode further comprises a branch connecting portion which is commonly connected to distal ends of branch portions which do not face the first conductive bar.

6. The display device of claim 3, wherein
   the plurality of ridge patterns of the first conductive bar comprise a first ridge pattern and a second ridge pattern consecutively disposed along a lengthwise direction of the first body,
   the branch portions comprise a first branch portion, a second branch portion and a third branch portion which face the first conductive bar and are sequential along a lengthwise direction of the first conductive bar,
   the first edge of the pixel electrode is common to distal ends of the first to third branch portions which face the first conductive bar,
   a first slit of the pixel electrode is defined between the first branch portion and the second branch portion, and a second slit of the pixel electrode is defined between the second branch portion and the third branch portion, and
   the first ridge pattern of the first conductive bar faces an end of the first slit which is at the first edge of the pixel electrode, and the second ridge pattern faces an end of the second slit which is at the first edge of the pixel electrode.

7. The display device of claim 6, wherein in the top plan view, the first conductive bar further comprises a groove pattern which is defined between the first ridge pattern and the second ridge pattern along the lengthwise direction of the first conductive bar, wherein the groove pattern faces the distal end of the second branch portion.

8. The display device of claim 6, wherein
   a first shortest distance between the edge of the first body and the distal end of the first branch portion is smaller than a second shortest distance between the edge of the first body and the distal end of the second branch portion, and
   a third shortest distance between the edge of the first body and the distal end of the third branch portion is greater than the second shortest distance.

9. The display device of claim 8, wherein
   the first and second ridge patterns respectively define a protruding length thereof from the distal end thereof to the edge of the first body, and
   the protruding length of the first ridge pattern is smaller than that of the second ridge pattern.

10. The display device of claim 8, wherein a shortest distance between the distal end of the first ridge pattern and the first edge of the first body is substantially equal to a shortest distance between the distal end of the second ridge pattern and the first edge of the first body.

11. The display device of claim 1, further comprising:
    a second conductive bar which is adjacent to and separated from a second edge of the pixel electrode opposite the first edge thereof in the top plan view, the second conductive bar disposed in the same layer as the pixel electrode; and
    a second connecting portion which connects the second conductive bar and the pixel electrode to each other and is in the same layer as the pixel electrode,
    wherein in the top plan view, the second conductive bar comprises:
       a second body which lengthwise extends along the second edge of the pixel electrode and includes an edge which faces the second edge of the pixel electrode, and
       a plurality of ridge patterns which each protrude from the edge of the second body and toward the pixel electrode.

12. The display device of claim 1, further comprising:
    a gate line which is on the base substrate and lengthwise extends along a first direction; and
    a first data line which is on the base substrate, is insulated from the gate line, and lengthwise extends in a second direction intersecting the first direction,
    wherein the first conductive bar lengthwise extends along the second direction and does not overlap the pixel electrode and the first data line.

13. The display device of claim 12, further comprising a shielding electrode which is disposed overlapping the first data line, is separated from the pixel electrode and the first conductive bar in the top plan view, and is disposed in the same layer as the pixel electrode.

14. The display device of claim 12, further comprising a storage electrode line which is on the base substrate and overlaps the first conductive bar.

15. The display device of claim 12, further comprising:
    a second data line which is on the base substrate, is insulated from the gate line, and lengthwise extends in the second direction;
    a second conductive bar which is adjacent to and separated from a second edge of the pixel electrode opposite the first edge thereof in the top plan view, the second conductive bar disposed in the same layer as the pixel electrode; and a second connecting portion which connects the second conductive bar and the pixel electrode to each other and is in the same layer as the pixel electrode, wherein in the top plan view the second conductive bar comprises:

a second body which lengthwise extends along the second edge of the pixel electrode and includes an edge which faces the second edge of the pixel electrode, and a plurality of ridge patterns which each protrude from the edge of the second body and toward the pixel electrode.

16. A mask for manufacturing a display device, the mask comprising:

a pixel electrode pattern corresponding to a pixel electrode of the display device;

a first conductive bar pattern which corresponds to a first conductive bar of the display device, and is adjacent to and separated from a first edge of the pixel electrode pattern in a top plan view; and a first connecting portion pattern which corresponds to a first connecting portion of the display device and connects the first conductive bar pattern and the pixel electrode pattern to each other, wherein in the top plan view, the first conductive bar pattern comprises:

a first body pattern which corresponds to a first body of the first conductive bar, lengthwise extends along the first edge of the pixel electrode pattern and includes an edge which faces the first edge of the pixel electrode pattern, and a plurality of first patch patterns which correspond to first ridge patterns of the first conductive bar, and each protrude from the edge of the first body pattern and toward the pixel electrode pattern.

17. The mask of claim 16, wherein the pixel electrode pattern comprises a stem portion pattern and a plurality of branch portion patterns which respectively correspond to a stem portion and a plurality of branch portions of the pixel electrode, the plurality of branch portion patterns extending outwards from the stem portion pattern to define distal ends of the branch portion patterns, the first edge of the pixel electrode pattern is common to distal ends of branch portions patterns which face the first conductive bar pattern, and the distal ends of the branch portions patterns which face the first conductive bar pattern are separated from each other at the first edge of the pixel electrode pattern.

18. The mask of claim 17, wherein the pixel electrode pattern further comprises a branch connecting portion pattern which corresponds to a branch connecting portion of the pixel electrode and commonly connects distal ends of branch portion patterns which do not face the first conductive bar pattern.

19. The mask of claim 16, further comprising a shielding electrode pattern which corresponds to a shielding electrode of the display device, wherein in the top plan view, the shielding electrode pattern is disposed facing an edge of the first body pattern opposite to the edge thereof which faces the first conductive bar pattern, and the shielding electrode pattern is separated from the first conductive bar pattern.

20. The mask of claim 16, further comprising:

a second conductive bar pattern which corresponds to a second conductive bar of the display device, the second conductive bar pattern adjacent to and separated from a second edge of the pixel electrode pattern opposite the first edge thereof in the top plan view; and a second connecting portion pattern which corresponds to a second connecting portion of the display device and connects the second conductive bar pattern and the pixel electrode pattern to each other, wherein in the top plan view, the second conductive bar pattern comprises:

a second body pattern which corresponds to a second body of the second conductive bar, lengthwise extends along the second edge of the pixel electrode pattern and includes an edge which faces the second edge of the pixel electrode pattern, and a plurality of second patch patterns which correspond to second ridge patterns of the second conductive bar, and each protrude from the edge of the second body pattern and toward the pixel electrode pattern.

* * * * *